(12) United States Patent
Gao et al.

(10) Patent No.: US 11,737,297 B2
(45) Date of Patent: Aug. 22, 2023

(54) ORGANIC ELECTROLUMINESCENT DEVICE

(71) Applicant: BEIJING SUMMER SPROUT TECHNOLOGY CO., LTD., Beijing (CN)

(72) Inventors: Liang Gao, Beijing (CN); Huiqing Pang, Beijing (CN); Menglan Xie, Beijing (CN); Chuanjun Xia, Beijing (CN); Chi Yuen Raymond Kwong, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 265 days.

(21) Appl. No.: 17/071,556

(22) Filed: Oct. 15, 2020

(65) Prior Publication Data

US 2021/0119162 A1 Apr. 22, 2021

(30) Foreign Application Priority Data

Oct. 17, 2019 (CN) .......................... 201910987157.0

(51) Int. Cl.
*H10K 50/13* (2023.01)
*H10K 50/11* (2023.01)
(Continued)

(52) U.S. Cl.
CPC ............. *H10K 50/13* (2023.02); *H10K 50/11* (2023.02); *H10K 71/10* (2023.02); *H10K 71/30* (2023.02); *H10K 85/653* (2023.02); *H10K 85/654* (2023.02); *H10K 85/655* (2023.02); *H10K 85/6574* (2023.02); *H10K 2101/30* (2023.02);
(Continued)

(58) Field of Classification Search
CPC ............. H01L 27/3209; H01L 2251/53; H01L 51/504; H01L 51/506; H01L 51/002; H01L 27/3204; H01L 51/5064
See application file for complete search history.

(56) References Cited

U.S. PATENT DOCUMENTS 6,717,358 B1 4/2004 Liao et al.
2003/0198831 A1* 10/2003 Oshiyama ........... H01L 51/5016
313/506

(Continued)

OTHER PUBLICATIONS

Angel, 2017, Effect of lithium and silver diffusion in single-stack and tandem OLED devices, Organic Electronics, 42, 18 pages.
(Continued)

*Primary Examiner* — Gregory D Clark
(74) *Attorney, Agent, or Firm* — Brown Rudnick LLP; Matthew P. York

(57) ABSTRACT

Provided is an organic electroluminescent device. The organic electroluminescent device comprises a first electrode, a second electrode, and at least two light emitting units disposed between the first electrode and the second electrode, wherein the light emitting units each comprises at least one light emitting layer, and a connection layer of a specific structure is further disposed between adjacent two light emitting units. By using a connection layer of a specific structure, the organic light-emitting device reduces the device voltage, prolongs life time of the device, and improves the device performance.

20 Claims, 5 Drawing Sheets

(51) Int. Cl.
*H10K 71/10* (2023.01)
*H10K 71/30* (2023.01)
*H10K 85/60* (2023.01)
*H10K 101/40* (2023.01)
*H10K 101/30* (2023.01)
*H10K 102/00* (2023.01)

(52) U.S. Cl.
CPC ... *H10K 2101/40* (2023.02); *H10K 2102/302* (2023.02)

(56) References Cited

U.S. PATENT DOCUMENTS

| | | |
|---|---|---|
| 2005/0121667 A1 | 6/2005 | Kuehl et al. |
| 2008/0171226 A1 | 7/2008 | Noh et al. |
| 2016/0141338 A1 | 5/2016 | Li |
| 2016/0285025 A1 | 9/2016 | Park |
| 2019/0074446 A1 | 3/2019 | Xia |
| 2019/0181349 A1 | 6/2019 | Xia |
| 2020/0062778 A1 | 2/2020 | Cui et al. |
| 2020/0087311 A1 | 3/2020 | Cui et al. |
| 2020/0231602 A1 | 7/2020 | Wang et al. |
| 2021/0167298 A1 | 6/2021 | Pang et al. |
| 2021/0280795 A1 | 9/2021 | Cui |
| 2021/0296594 A1 | 9/2021 | Ding et al. |

OTHER PUBLICATIONS

Chang, 2004, High-Efficiency Organic Electroluminscent Device with Multiple Emitting Units, Japanese Journal of Applied Physics, 43:6418-6422.

Lai, 2007, Copper hexadecafluorophthalocyanine and copper phthalocyanine as a pure organic connecting unit in blue tandem organic light-emitting devices, Journal of Applied Physics, 101:014509, 4 pages.

Liao, 2008, Power efficiency improvement in a tandem organic light-emitting diode, Appl Phys Lett, 92(22):223311, 4 pages.

Sun, 2005, Effective intermediate layers for highly efficient stacked organic light-emitting devices, Applied Phys Letters, 87:093504, 4 pages.

Talik, 2014, Efficient green phosphorescent tandem organic light emitting diodes with solution processable mixed hosts charge generating layer, Journal of Luminescence, 154:345-349.

Tang, 1987, Organic electroluminescent diodes, Applied Physics Letters, 51(12):913-15.

* cited by examiner

ORGANIC ELECTROLUMINESCENT DEVICE

CROSS-REFERENCE TO RELATED APPLICATION(S)

This application claims priority to Chinese Patent Application No. CN 201910987157.0 filed on Oct. 17, 2019, the disclosure of which is incorporated herein by reference in its entirety.

TECHNICAL FIELD

The present disclosure relates to an organic electroluminescent device. More specifically, the present disclosure relates to an organic electroluminescent device including multiple light emitting units and a specific connection layer.

BACKGROUND

The organic light-emitting device (OLED) is composed of a cathode, an anode and organic light emitting materials stacked between the cathode and the anode, which, by applying voltages at both the cathode and the anode of the OLED, converts electric energy into light, and has the advantages of wide angle, high contrast and fast response time. In 1987, Tang and Van Slyke of Eastman Kodak Company reported an organic light-emitting device, which includes an arylamine hole transporting layer and a tris-8-hydroxyquinoline-aluminum layer as the electron transporting layer and the light emitting layer (*Applied Physics Letters,* 1987, 51 (12): 913-915). Once a bias is applied to the device, green light was emitted from the device. This invention has laid the foundation for the development of modern organic light-emitting diodes (OLEDs). Since the OLED is a self-luminescent solid-state thin film device, it provides great potential for display and lighting applications.

In terms of device structure, OLEDs can be classified into conventional OLEDs having a monolayer structure and OLEDs having a tandem structure (also called the stack structure). The conventional OLED includes only one light emitting unit between the cathode and the anode while the tandem OLED has multiple light emitting units stacked. One light emitting unit generally includes at least one light emitting layer, a hole transporting layer and an electron transporting layer. Besides the above-mentioned layers, the light emitting unit may further include a hole injection layer, an electron injection layer, a hole blocking layer and an electron blocking layer. Note that although the conventional monolayer OLED has only one light emitting unit, this light emitting unit may include multiple light emitting layers, for example, the light emitting unit may include a yellow light emitting layer and a blue light emitting layer. However, each light emitting unit includes only one pair of hole transporting layer and electron transporting layer. The tandem OLED includes at least two light emitting units, that is, the tandem OLED includes at least two pairs of hole transporting layer and electron transporting layer. Herein, multiple light emitting units are arranged in a vertically-stacked physical form, which realizes a tandem characteristic on the circuit, thus this kind of OLEDs is referred to as the tandem OLED (in terms of the circuit connection) or the stacked OLED (in terms of the physical form). That is, under the same brightness, the current density required by the tandem OLED is smaller than that of the conventional monolayer OLED, thus the life time is prolonged. On the contrary, at a constant current density, the brightness of the tandem OLED is higher than that of the conventional monolayer OLED, but its voltage increases accordingly. Adjacent light emitting units of the tandem OLED are connected by a charge generation layer, and the quality of the charge generation layer directly affects parameters of the tandem OLED such as voltage, life time and efficiency. Therefore, the region of the charge generation layer is required to be able to effectively generate holes and electrons and to smoothly inject the holes and electrons to corresponding light emitting units, and is also required to have greater transmittance in the visible light range, and at the same time, it needs to have stable performance and easy to be prepared.

The charge generation layer generally includes two parts, namely, an n-type material and a p-type material, to generate electrons and holes, and the combinations reported are generally inorganic n-type metals/inorganic metals, such as Ca/Ag and Al/Au (*Appl. Phys. Lett.* 2005, 87, 093504). In the application No. US20160285025A1, the charge generation layer is formed by two metal layers, where the first metal layer incudes a metal selected from Li, Cs, Na, Ba, Ca, Mg and Al, and the second metal layer incudes a metal selected from Au, Ag, Cu, Sn, Ti and Al. There are also reported combinations of metal-doped n-type organic materials/inorganic p-type metals or oxides, such as $Mg:Alq_3/WO_3$ (*Jpn. J. Appl. Phys.* 43 6418) or Bphen:Li/HAT-CN (*Appl. Phys. Lett.* 2008, 92, 223311). For this combination, the n-type material of the charge generation layer commonly used consists of an alkali metal or an alkali metal compound doped with an organic electron transporting material with high electron mobility, such as $CsN_3$:Bphen, Li:Bphen, $Mg:Alq_3$, $Li:Alq_3$ and the like. The p-type material of the charge generation layer commonly used consists of organic hole transporting materials or metal oxides, such as $MoO_3$, $WO_3$, $V_2O_5$, HATCN and the like. The charge generation layer may also use n-type organic materials/p-type organic materials, such as F16CuPc/CuPc (*J. Appl. Phys.* 2007, 101, 014509). In the above material expressions, the symbol ":" refers to a mixture of two materials, and the symbol "/" refers to a laminate of two components before and after this symbol.

The application No. US20080171226A1 discloses a white organic light emitting device, which comprises a charge generation layer. In the charge generation layer, the n-type material is composed of $Cs_2CO_3$ doped in BCP, and the p-type material is composed of $MoO_3$. However, for the above metal oxide, the vapor deposition temperature is too high, the transmittance is poor, the conductivity is weak, and it is badly compatible with organic films, so it is not ideal p-type material, and would affect the overall efficiency of the device. In order to improve the charge transport ability, the n-type material needs to be doped with an alkali metal such as Li. In this case, $Li_3N$ is vapor-deposited, and in the process of vapor deposition, $Li_3N$ is decomposed into Li and $N_2$ (*Organic Electronics,* 42, 102). $N_2$ would affect the vacuum degree of the vapor deposition chamber, decrease the vacuum degree and thus affect the quality of the device. Besides, simultaneous deposition of organic electron transporting materials and alkali metal materials would make the vapor deposition process complex and cause the cross contamination of materials in the vacuum chamber.

The U.S. Pat. No. 6,717,358B1 discloses an organic electroluminescent device comprising an electron-transporting layer which can improve voltage stability and which is composed of, in sequence, an n-type material layer, an interfacial layer, and a p-type material layer. Although the electron-transporting layer can improve the voltage stability of the device, the n-type material is composed of an organic electron transporting material doped with an alkali metal. In this case, on one hand, the vapor co-deposition of two materials makes the process complex, and on the other hand, the vapor deposition of the alkali metal would affect the vacuum degree of the vapor deposition chamber. The material of the interfacial layer is composed of oxides, sulfides, selenides, nitrides or carbides of certain metals, such as the compound of metals titanium, zirconium, molybdenum and lead.

The application No. US20160141338A1 discloses a tandem device including a charge generation layer which includes, in sequence, a hole transporting layer, an electron-hole generation layer, an active metal layer, and an electron transporting layer, where the electron-hole generation layer consists of HATCN or a metal oxide. Although each layer is vapor-deposited separately and the process is simpler without vapor co-deposition, the charge generation layer has a large number of layers and complex structure, and the metal layer is not compatible with the organic layer composed of HATCN with a lowest unoccupied molecular orbital (LUMO) energy level of only 4.8 eV, which means that the hole injection ability is poor, thereby resulting in a fact that the voltage and life time cannot meet requirements. Therefore, this device needs to be further improved.

In the literature *Journal of Luminescence*, 154, 345-349, the device of the following structure was prepared: ITO/PEDOT:PSS/PVK:PBD(70:30 w/w):Ir(ppy)$_3$(1 wt %)/LiF(1 nm)/Al(10 nm)/HATCN/TAPC:PVK/PVK:PBD(70:30 w/w):Ir(ppy)$_3$(1 wt %)/LiF/Al, among which the two layers, HATCN/TAPC:PVK, were used as the charge generation layer, all layers except LiF and Al were spin-coated, and the transmittance of the Al film with the thickness of 10 nm in the visible light range was poor, limiting the further improvement of device efficiency. The structure of the disclosed light emitting unit is too simple, so the device performance needs to be further improved.

At present, although the tandem electroluminescent device has been widely studied, it still has some disadvantages, such as high voltage, no significant increase in life time, complicated preparation process and the like, which are mainly caused by performance defects of the connection layer connecting the light emitting units.

SUMMARY

To solve the above problems, the present disclosure aims to provide a tandem organic electroluminescent device to solve at least part of the above-mentioned problems. The tandem organic electroluminescent device disclosed herein is provided with a specific connection layer between two light emitting units, which reduces the device voltage, prolongs life time of the device, and improves the device performance.

According to an embodiment of the present disclosure, disclosed is an organic electroluminescent device including:
a first electrode,
a second electrode, and
at least two light emitting units disposed between the first electrode and the second electrode;
wherein the light emitting units each includes at least one light emitting layer;
wherein a connection layer consisting of a metal layer and a buffer layer is further disposed between at least one set of adjacent two light emitting units, wherein the material of the buffer layer is an organic material; and
wherein the light emitting unit in contact with the buffer layer further includes a hole injection layer, and the hole injection layer of the light emitting unit in contact with the buffer layer includes the material of the buffer layer.

According to another embodiment of the present disclosure, disclosed is an organic electroluminescent device including:
a first electrode,
a second electrode, and
at least two light emitting units disposed between the first electrode and the second electrode;
wherein the light emitting units each includes at least one light emitting layer;
wherein a connection layer consisting of a metal layer and a buffer layer is further disposed between at least one set of adjacent two light emitting units; and
wherein the material of the buffer layer is an organic material, and the organic material has a lowest unoccupied molecular orbital (LUMO) energy level of greater than 4.9 eV.

According to another embodiment of the present disclosure, a display assembly comprising any organic electroluminescent device described above is further disclosed.

The tandem organic electroluminescent device disclosed in the present disclosure is provided with a specific connection layer between two light emitting units, which reduces the device voltage, prolongs life time of the device, and improves the device performance. In the present disclosure, the connection layer is composed of a metal layer and an organic buffer layer. The material used by the metal layer has a high electron injection ability, is easy to be deposited and is compatible with the organic material of the buffer layer, and the connection layer does not require complex co-vaporization process, and the process is simple. Therefore, the tandem electroluminescent device with such the connection layer can significantly improve the device performance.

DETAILED DESCRIPTION

Figure 1:
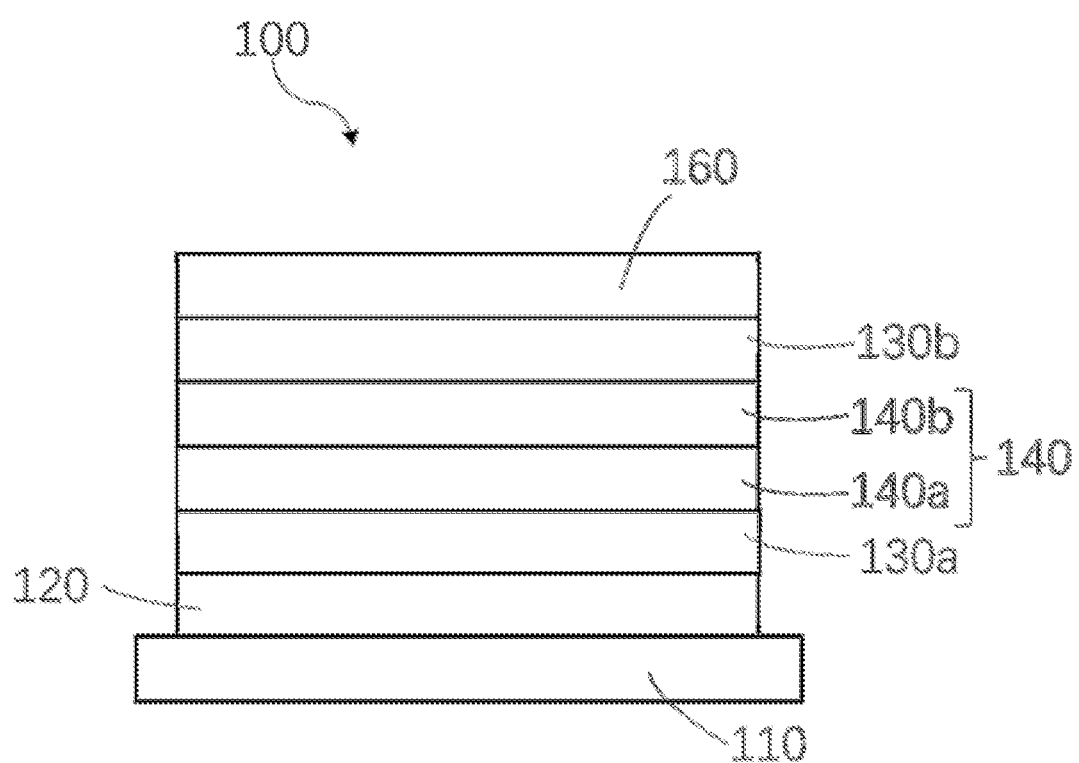
FIG. 1 is a schematic diagram of a tandem organic electroluminescent device 100 according to a specific embodiment of the present disclosure.

The OLED can be fabricated on various types of substrates such as glass, plastic and metal. FIG. 1 schematically shows a sectional diagram of a tandem organic electroluminescent device 100 without limitation. The diagram is not necessarily drawn in scale, and some of layers can be omitted in the diagram as needed. The tandem organic electroluminescent device 100 includes a substrate 110, a first electrode 120, a first light emitting unit 130a, a second light emitting unit 130b, a second electrode 160, and a connection layer 140, where the connection layer is composed of a metal layer 140a and a buffer layer 140b. The substrate 110 may be a substrate having a high transmittance or a bendable substrate, such as glass, plastic or metal. OLED devices may also be classified into bottom-emitting OLED devices and top-emitting OLED devices in terms of structure. The bottom-emitting OLED device refers to the OLED device emitting light from the substrate, and the top-emitting OLED device refers to the OLED device emitting light from the second electrode of the device.

As used herein, "top" means being located furthest away from the substrate while "bottom" means being located closest to the substrate. In a case where a first layer is described as "being disposed over" a second layer, the first layer is disposed further away from the substrate. There may be other layers between the first and second layers, unless it is specified that the first layer is "in contact with" the second layer. For example, a cathode may be described as "being disposed over" an anode, even though there are various organic layers between the cathode and an anode. Similarly, the expression that the first layer is "in contact with" the second layer means that there are no other layers between the first layer and the second layer.

The filming process of the metal film is as follows: on the substrate surface, atoms form uniform, small and moveable atom clusters, which are also called "islands"; these islands continue to accept new deposited atoms and then merge with other islands to become bigger; in the process of merging, new islands are gradually formed on the substrate surface which is vacated due to the merging, and then these new islands merge again, and the process repeats until a structurally continuous film is formed when all isolated islands are joined together, or a discontinuous film is formed when the isolated islands are not joined together. In an exemplary embodiment of the present disclosure, the buffer layer of the connection layer is ytterbium, and the atomic radius of the metal, ytterbium, is 2.4 angstroms (Å) (https://www.lookchem.cn/yuansu/101/). When the thickness of the vapor-deposited film is 10 Å, which is equivalent to the thickness of two atoms, these two atoms can only form isolated islands, and in this case, the formed film is discontinuous.

The transmittance herein refers to the percentage of transmitted light penetrated through the detected film to the incident light, measured in the range of visible light (380-780 nm). The transmittance of different films usually varies with wavelength. The transmittance described herein refers to the maximum transmittance in the visible light range.

The light emitting unit herein refers to a unit of organic material layers that can emit light with a voltage or current applied, and the light emitting unit may include one or more light emitting layers. The light emitting unit generally also includes one or more organic material layers to inject or transfer charge. For example, besides the light emitting layer, the light emitting unit may further include at least a hole injection layer, a hole transporting layer, an electron blocking layer, a hole blocking layer, an electron transporting layer and an electron injection layer. For example, in an exemplary embodiment of the present disclosure, the light emitting unit close the anode is composed of, in sequence, a hole injection layer, a hole transporting layer, an electron blocking layer, a light emitting layer, a hole blocking layer and an electron transporting layer, and the light emitting unit close to the cathode is composed of a hole injection layer, a hole transporting layer, an electron blocking layer, a light emitting layer, a hole blocking layer, an electron transporting layer and an electron injection layer. In an embodiment, one OLED device may be described as an OLED device having an "organic layer" disposed between the cathode and the anode. The organic layer may include one or more layers.

The device fabricated in accordance with the embodiments of the present disclosure may be incorporated into various consumer products having one or more electronic component modules (or units) of the device. Some examples of such consumer products include flat panel displays, monitors, medical monitors, televisions, billboards, lights for indoor or outdoor lighting and/or signaling, head-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The work function of the metal herein refers to the minimum energy needed to move an electron from the interior to the surface of an object. The "work function of the metal" herein is represented by absolute values (positive values), that is, the higher the numerical value, the more the energy needed to pull the electron to the vacuum level. As described herein, the magnitude of the "work function of the metal" means the magnitude of the absolute value. For example, "the work function of the metal is greater than 5 eV" means that the energy needed to pull the electron to the vacuum level is greater than 5 eV.

The numerical values of highest occupied molecular orbital (HOMO) and lowest occupied molecular orbital (LUMO) mentioned herein are calculated by using the Gaussian 09 software, B3LYP method and 6-311 g (d) basis set. Levels of the "HOMO" and "LUMO" are represented by absolute values (positive values), that is, the greater the numerical value, the deeper the level. For example, the LUMO level of HATCN is calculated to be 4.81 eV by this method.

The "connection layer", as used herein, is a layer disposed between two light emitting units to provide electrons and holes. It consists of a metal layer and a buffer layer, in which the metal layer is in contact with the electron transporting layer or electron injection layer of a light emitting unit, and the buffer layer is in contact with the hole injection layer or hole transporting layer of an adjacent light emitting unit. The "connection layer" may be a part of a charge generation layer, or may be a charge generation layer. When the "connection layer" is a part of a charge generation layer, the connection layer can further form the charge generation layer with the p-type material which generates holes in the light emitting unit, where the metal material is used as the n-type material to generate electrons, the buffer layer is used for optimizing the interface, and the p-type material is the material of the hole injection layer of a next light emitting unit. When the "connection layer" is a charge generation layer, the metal material is used as the n-type material to generate electrons, and the buffer layer is used as the p-type material to generate holes, especially when the buffer layer is thick to form a continuous or near-continuous film.

The "buffer layer", as used herein, is a layer having a function of optimizing the interface, optionally, having a function of generating holes, and it is a part of the connection layer. When the "connection layer" is a part of a charge generation layer, the "buffer layer" has a function of optimizing the interface, reducing interface defects, and ensuring the smooth transport of carriers. When the "connection layer" is a charge generation layer, the material of the "buffer layer" as a p-type material has a function of generating holes as well as a function of optimizing the interface. The material of the buffer layer herein is an organic material, preferably an organic material having a LUMO energy level greater than 4.9 eV, more preferably a compound having a structure represented by Formula 1 or a quinone compound and derivatives thereof.

Definition of Terms of Substituents

Halogen or halide—as used herein includes fluorine, chlorine, bromine, and iodine.

Alkyl—contemplates both straight and branched chain alkyl groups. Examples of the alkyl group include methyl, ethyl, propyl, iso-propyl, n-butyl, sec-butyl, iso-butyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, neopentyl, 1-methylpentyl, 2-methylpentyl, 1-pentylhexyl, 1-butylpentyl, 1-heptyloctyl, and 3-methylpentyl. Additionally, the alkyl group may be optionally substituted. The carbons in the alkyl chain can be replaced by other hetero atoms. Of the above, preferred are methyl, ethyl, propyl, iso-propyl, n-butyl, sec-butyl, iso-butyl, t-butyl, n-pentyl, and neopentyl.

Cycloalkyl—as used herein contemplates cyclic alkyl groups. Preferred cycloalkyl groups are those containing 4 to 10 ring carbon atoms, and include cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl, allyl, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, and 3-phenyl-1-butenyl. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or the aromatic group—as used herein includes non-condensed and condensed systems. Preferred aryl groups are those containing 6 to 60 carbon atoms, preferably 6 to 20 carbon atoms, more preferably 6 to 12 carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl p-terphenyl-4-yl, o-cumenyl, m-cumenyl, p-cumenyl, 2,3-xylyl, 3,4-xylyl, 2,5-xylyl, mesityl, and m-quarterphenyl.

The heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from a nitrogen atom, an oxygen atom, a sulfur atom, and a selenium atom.

Heteroaryl—as used herein contemplates non-condensed and condensed hetero-aromatic groups that may include from 1 to 5 heteroatoms. Preferred heteroaryl groups are those containing 3 to 30 carbon atoms, preferably 3 to 20 carbon atoms, more preferably 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxadiazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—is represented by —O-alkyl. Examples and preferred examples of alkyl are the same as those described above. Examples of the alkoxy group having 1 to 20 carbon atoms, preferably 1 to 6 carbon atoms include methoxy, ethoxy, propoxy, butoxy, pentyloxy, and hexyloxy. The alkoxy group having 3 or more carbon atoms may be linear, cyclic or branched.

Aryloxy—is represented by —O-aryl or —O-heteroaryl. Examples and preferred examples of aryl and heteroaryl are the same as those described above. Examples of the aryloxy group having 6 to 40 carbon atoms include phenoxy and biphenyloxy.

Arylalkyl—as used herein refers to an alkyl group that has an aryl substituent. Additionally, the arylalkyl group may be optionally substituted. Examples of the arylalkyl group include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

Alkyl, cycloalkyl, alkenyl, alkynyl, arylalkyl, heterocyclic groups, aryl, and heteroaryl may be unsubstituted or may be substituted by one or more selected from the group consisting of deuterium, halogen, alkyl, cycloalkyl, arylalkyl, alkoxy, aryloxy, amino, a cyclic amino group, silyl, alkenyl, cycloalkenyl, heteroalkenyl, alkynyl, aryl, heteroaryl, acyl, carbonyl, carboxylic acid, ether, ester, cyano, isocyano, thiolalkyl, sulfinyl, sulfonyl, phosphino and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, hydrogen atoms may be partially or fully replaced by deuterium. Other atoms such as carbon and nitrogen may also be replaced by other stable isotopes thereof. The replacement with other stable isotopes in the compounds may be preferred due to their attribution to the enhancement of device efficiency and stability.

In the compounds mentioned in the present disclosure, multiple substitutions refer to a range that includes a double substitution, up to the maximum available substitutions.

In the compounds mentioned in the present disclosure, the expression that adjacent substituents can be optionally joined to form a ring is intended to mean that two radicals are joined to each other via a chemical bond. This is exemplified by the following formula:

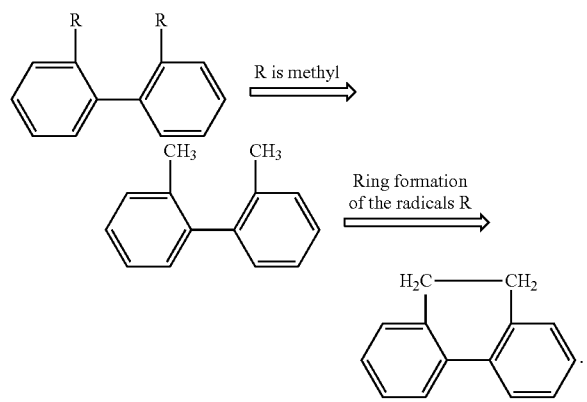

Furthermore, the expression that adjacent substituents can be optionally joined to form a ring is also intended to mean that, in the case where one of the two radicals represents hydrogen, the second radical is bonded at the position at which the hydrogen atom is bonded, thereby forming a ring. This is exemplified by the following formula:

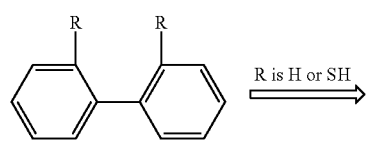

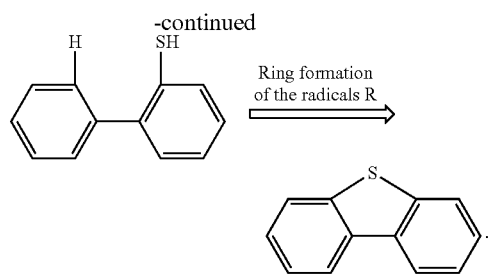

According to an embodiment of the present disclosure, disclosed is an organic electroluminescent device including:

a first electrode, a second electrode, and at least two light emitting units disposed between the first electrode and the second electrode;

wherein the light emitting units each includes at least one light emitting layer;

wherein a connection layer consisting of a metal layer and a buffer layer is further disposed between at least one set of adjacent two light emitting units, wherein the material of the buffer layer is an organic material; and wherein the light emitting unit in contact with the buffer layer further includes a hole injection layer, and the hole injection layer of the light emitting unit in contact with the buffer layer includes the material of the buffer layer.

According to another embodiment of the present disclosure, disclosed is an organic electroluminescent device including:

a first electrode, a second electrode, and at least two light emitting units disposed between the first electrode and the second electrode;

wherein the light emitting units each includes at least one light emitting layer;

wherein a connection layer consisting of a metal layer and a buffer layer is further disposed between at least one set of adjacent two light emitting units; and wherein the material of the buffer layer is an organic material, and the organic material has a LUMO energy level of greater than 4.9 eV.

In the above embodiments, the light emitting layer of the light emitting unit may emit light of the same color or light of different colors.

In the above embodiments, the expression that "a connection layer is further disposed between at least one set of adjacent two light emitting units" means that when there are only two light emitting units in the organic electroluminescent device, a connection layer is disposed between the two light emitting units; and when there are three or more light emitting units in the organic electroluminescent device, a connection layer is disposed between a set of adjacent two light emitting units or a connection layer is disposed between two or more sets of adjacent two light emitting units.

According to an embodiment of the present disclosure, the material of the buffer layer is a compound represented by Formula I, or a quinone compound and a derivative thereof:

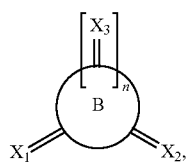
Formula 1
wherein the ring B represents a substituted or unsubstituted carbon ring having 3 to 30 ring atoms or a substituted or unsubstituted heterocyclic ring having 3 to 30 ring atoms;
wherein n is selected from an integer from 0 to 4, and $X_1$, $X_2$ and $X_3$ are, at each occurrence identically or differently, selected from the group consisting of:
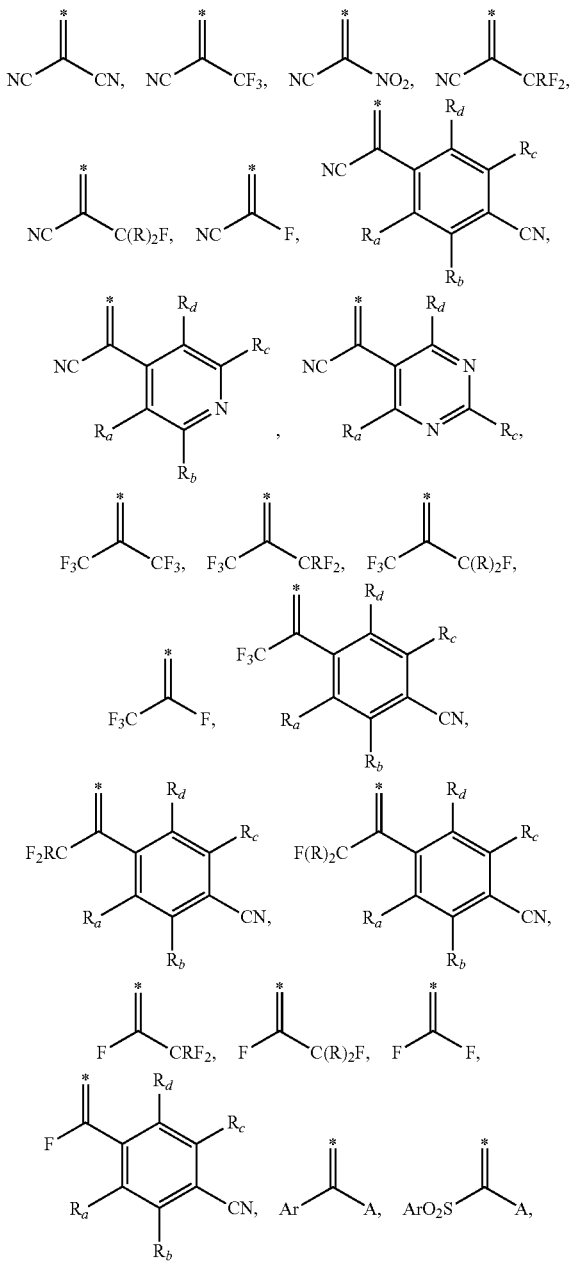
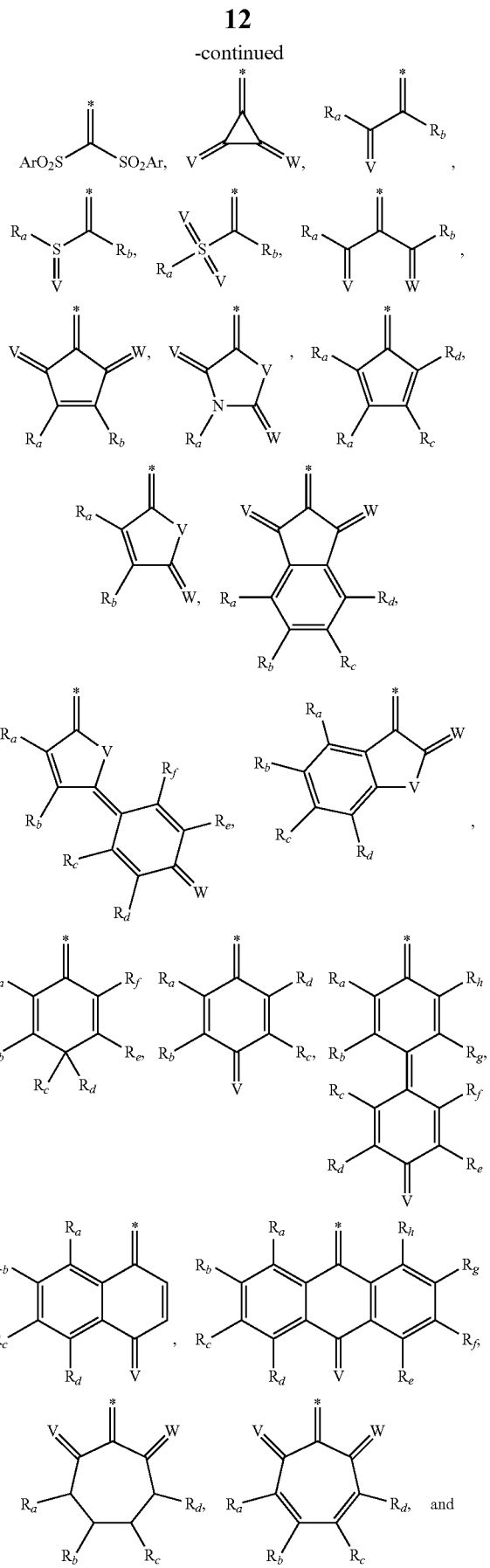

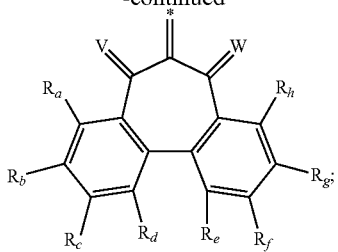

wherein V and W are selected from $CR_2R_3$, $NR_4$, O, S or Se;

wherein Ar is, at each occurrence identically or differently, selected from substituted or unsubstituted aryl having 6 to 30 carbon atoms, or a substituted or unsubstituted heteroaryl having 3 to 30 carbon atoms;

wherein R, $R_1$, $R_2$, $R_3$, $R_a$, $R_b$, $R_c$, $R_d$, $R_e$, $R_f$, $R_g$ and $R_h$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, unsubstituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof; and wherein A is a group having an electron-withdrawing group, and for any of the structures, when one or more of $R_a$, $R_b$, $R_c$, $R_d$, $R_e$, $R_f$, $R_g$ and $R_h$ occur, at least one of $R_a$, $R_b$, $R_c$, $R_d$, $R_e$, $R_f$, $R_g$ and $R_h$ is a group having an electron-withdrawing group; wherein a preferred group having an electron-withdrawing group is selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

According to an embodiment of the present disclosure, R is selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

According to an embodiment of the present disclosure, $X_1$, $X_2$ and $X_3$ are, at each occurrence identically or differently, selected from the group consisting of:

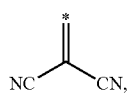

A1

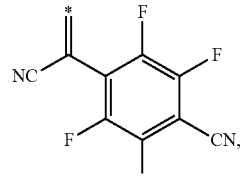

A2

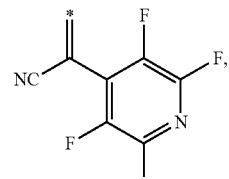

A3

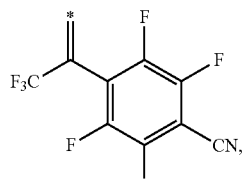

A4

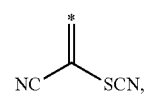

A5

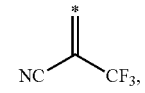

A6

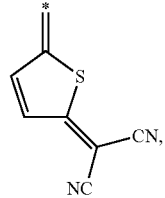

A7

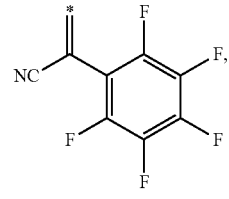

A8

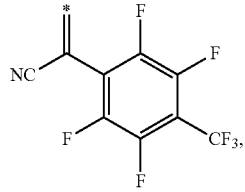

A9

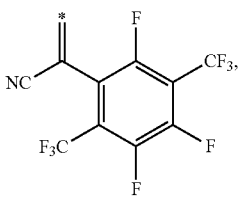

A10

-continued

A11, A12, A13, A14, A15

In this embodiment, * represents the position at which $X_1$, $X_2$ and $X_3$ are joined to the ring B.

According to another embodiment of the present disclosure, the ring B is selected from the group consisting of the following structures:

B1, B2, B3, B4, B5, B6, and B7;

wherein R' represents mono-substitution or di-substitution, and is, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, unsubstituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof; and adjacent substituents R' can be optionally joined to form a ring.

In this embodiment, * represents the position at which $X_1$, $X_2$ and $X_3$ are joined on the ring B.

According to an embodiment of the present disclosure, the material of the buffer layer is selected from the group consisting of:

Compound 1
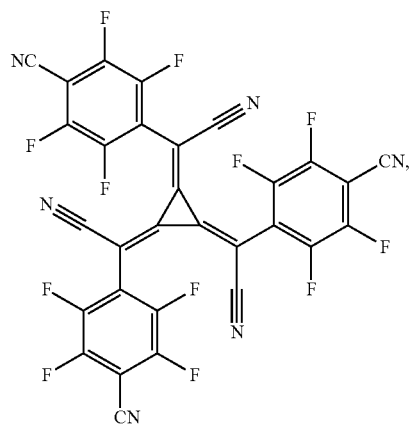
Compound 2
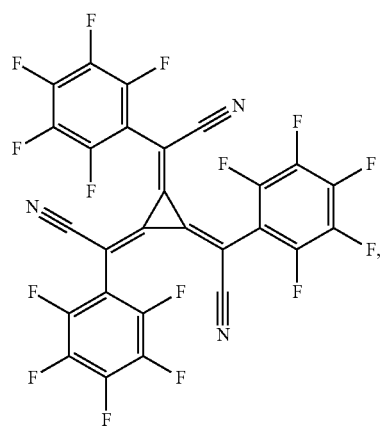
Compound 3
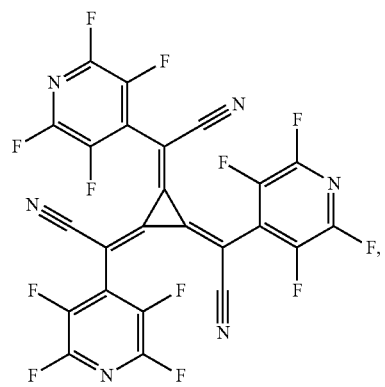
Compound 4
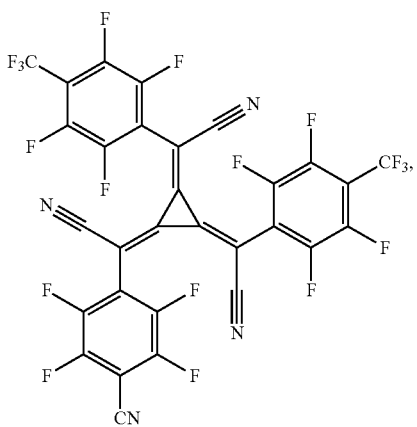
-continued
Compound 5
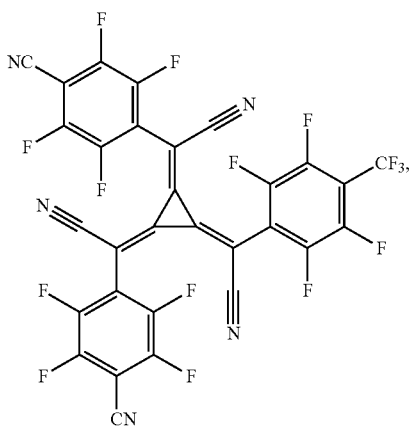
Compound 6
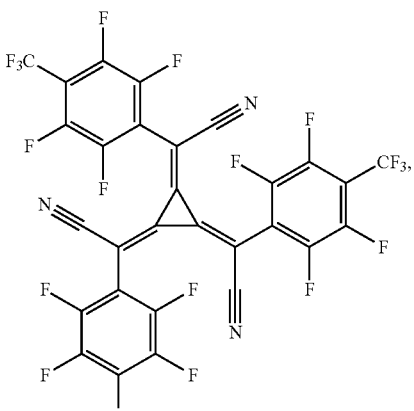
Compound 7
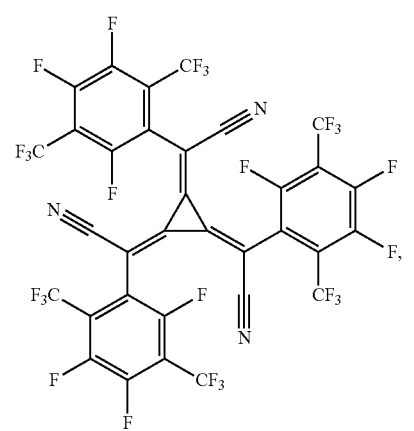

Compound 8
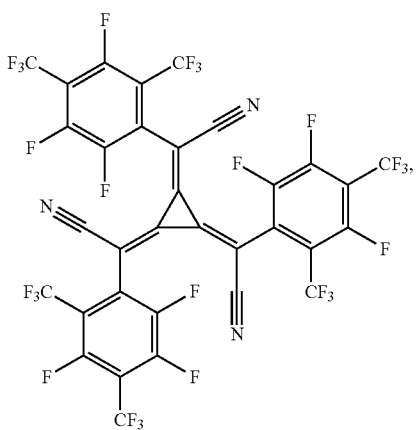
Compound 9
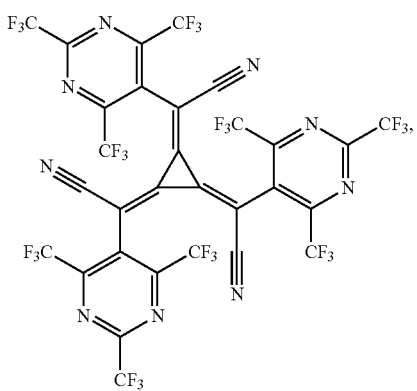
Compound 10
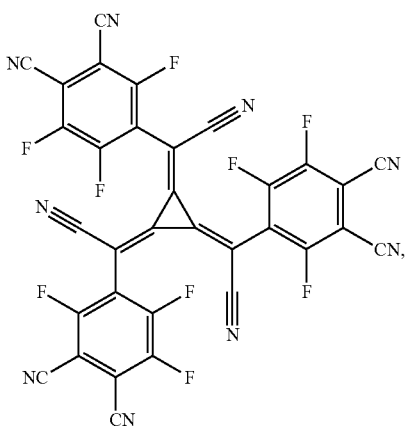
Compound 11
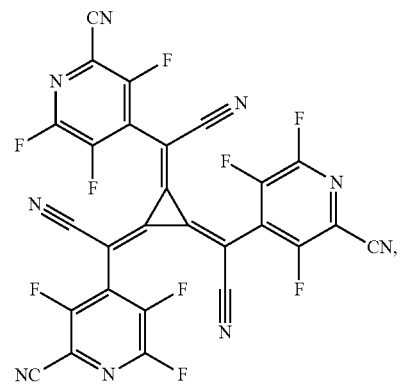
Compound 12
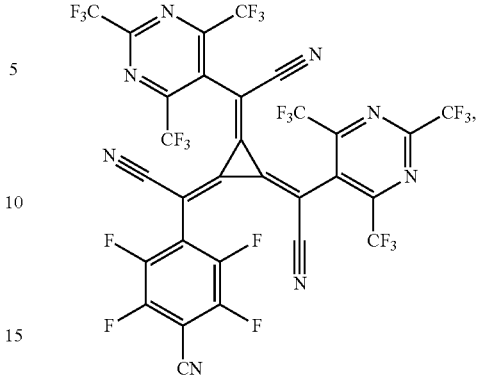
Compound 13
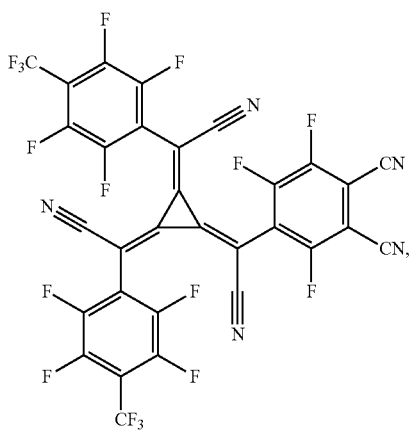
Compound 14
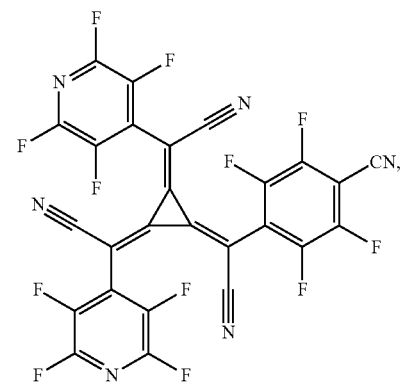
Compound 15
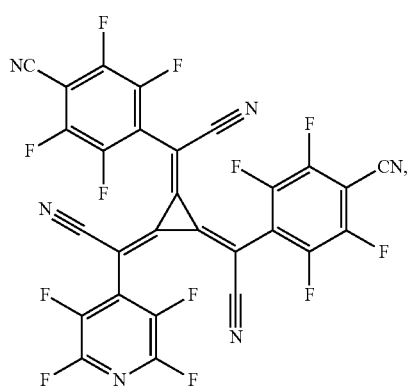

Compound 16
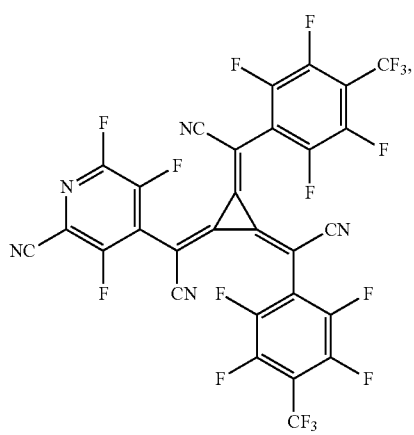
Compound 17
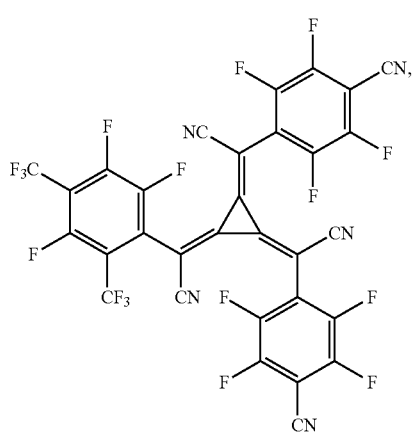
Compound 18
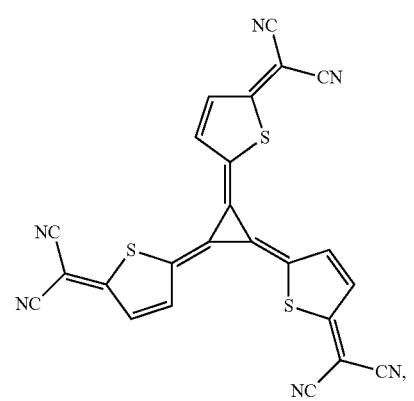
Compound 19
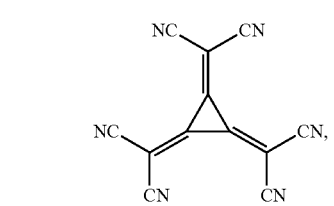
Compound 20
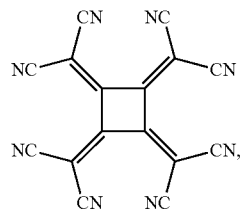
Compound 21
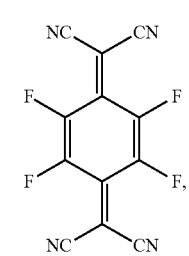
Compound 22
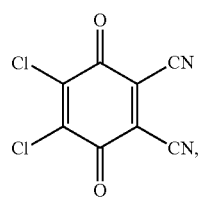
Compound 23
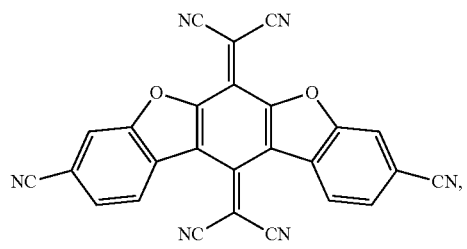
Compound 24
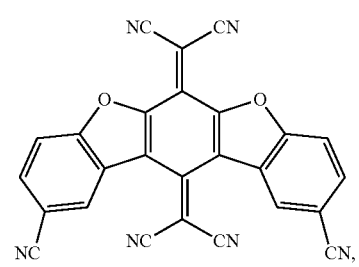
Compound 25
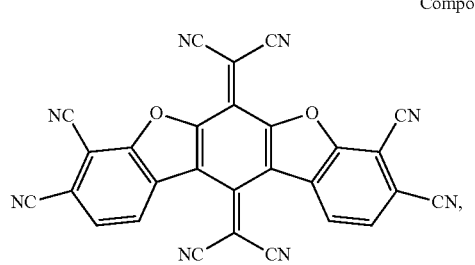

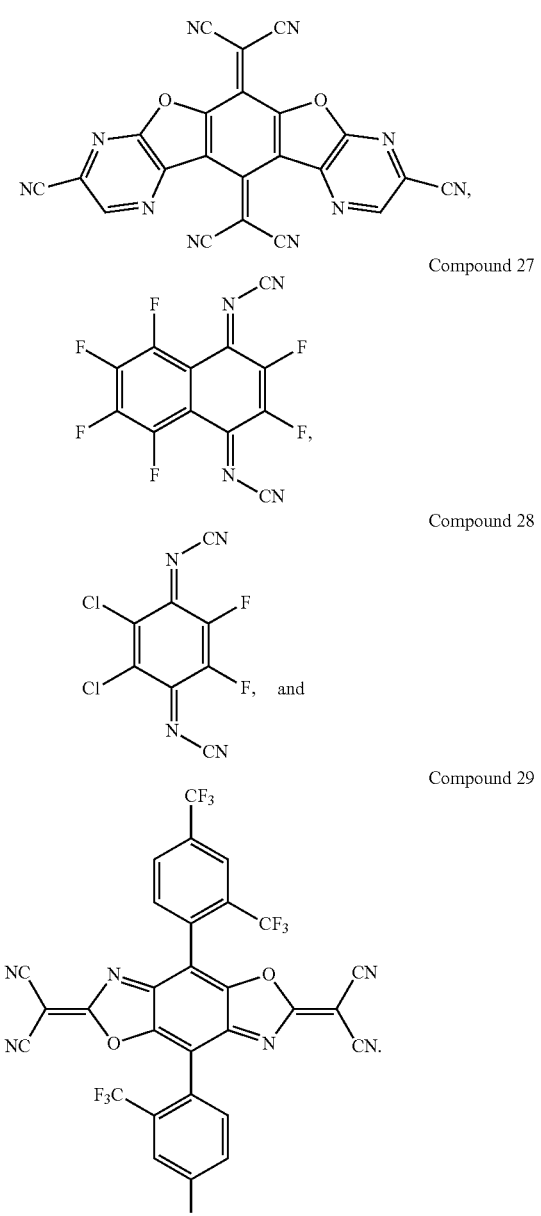

Compound 26

Compound 27

Compound 28

Compound 29

According to an embodiment of the present disclosure, a metal in the metal layer is selected from the group consisting of: Yb, Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Lu, Y, Mn, Ag, and combinations of a plurality thereof.

According to an embodiment of the present disclosure, the metal layer is formed by vapor deposition of one elemental metal, or is formed by vapor co-deposition of two or more elemental metals.

In the above embodiment, the metal of the metal layer may be an elemental metal, namely a metal having a purity greater than 99%, such as metal ytterbium having a purity greater than 99%. The metal layer may also be formed by vapor co-deposition of two or more metals, where the purity of each metal is greater than 99%. The expression that the purity of each metal is greater than 99% means that when the metal layer comprises a single metal, the purity of this metal is greater than 99%; when the metal layer comprises multiple metals, the purity of each metal during the vapor deposition is greater than 99%.

According to an embodiment of the present disclosure, the buffer layer has a thickness ranging from 0.1 nm to 30 nm, preferably from 0.5 nm to 20 nm, more preferably from 1 nm to 15 nm.

According to an embodiment of the present disclosure, the metal layer has a thickness ranging from 0.1 nm to 20 nm, preferably from 0.5 nm to 10 nm, more preferably from 1 nm to 5 nm.

According to an embodiment of the present disclosure, the metal layer has a work function of less than 4 eV.

According to an embodiment of the present disclosure, the material of the buffer layer has a LUMO energy level of greater than 4.9 eV, preferably greater than 5 eV.

The LUMO energy levels of compounds 1 to 28 were calculated by the Gaussian 09 software, B3LYP method and 6-311 g (d) basis set and shown in the following table.

| Compound No. | LUMO energy level (eV) |
|---|---|
| Compound 1 | 5.49 |
| Compound 2 | 4.92 |
| Compound 3 | 5.41 |
| Compound 4 | 5.26 |
| Compound 5 | 5.42 |
| Compound 6 | 5.34 |
| Compound 7 | 5.08 |
| Compound 8 | 5.21 |
| Compound 9 | 5.33 |
| Compound 10 | 5.84 |
| Compound 11 | 5.80 |
| Compound 12 | 5.97 |
| Compound 13 | 5.45 |
| Compound 14 | 5.44 |
| Compound 15 | 5.46 |
| Compound 16 | 5.44 |
| Compound 17 | 5.40 |
| Compound 18 | 5.24 |
| Compound 19 | 6.17 |
| Compound 20 | 6.18 |
| Compound 21 | 5.50 |
| Compound 22 | 5.27 |
| Compound 23 | 5.08 |
| Compound 24 | 5.28 |
| Compound 25 | 5.62 |

| Compound No. | LUMO energy level (eV) |
| --- | --- |
| Compound 26 | 5.39 |
| Compound 27 | 4.94 |
| Compound 28 | 5.28 |
| Compound 29 | 5.20 |

According to an embodiment of the present disclosure, transmittance of the connection layer in a visible light range is greater than 70%.

According to an embodiment of the present disclosure, the at least two light emitting units may emit light of the same color, or may emit light of different colors.

According to an embodiment of the present disclosure, at least one of the buffer layer and the metal layer forms a discontinuous film.

According to another embodiment of the present disclosure, a display assembly comprising the organic electroluminescent device is further disclosed.

A material of compound 1 was vapor-deposited in different thicknesses on the surface of clean silicon wafers to serve as a buffer layer, and the average surface roughness (Ra) was measured by atomic force microscopy as shown in Table 1. The surface roughness of the original silicon wafer is generally less than 0.5 nm, and the diameter of a small molecule is generally 0.1 nm. When a film with a thickness of 1 nm was vapor-deposited, the roughness was measured to be 8.31 nm, much larger than the roughness of the silicon wafer and the diameter of a small molecule, which indicates that the vapor-deposited film with the thickness of 1 nm was an island-shaped discontinuous film. When the thickness of the film increased to 10 nm, the surface roughness of the buffer layer sharply decreased to below 2 nm, very close to the surface roughness of the silicon wafer itself, which indicates that this layer of film was intending to be continuous.

TABLE 1

Average surface roughness (Ra) of the buffer layer with different thicknesses

| Thickness of the buffer layer [nm] | 1 | 5 | 10 |
| --- | --- | --- | --- |
| Ra [nm] | 8.31 | 3.01 | 1.92 |

Specifically, the surface roughness was 1 nm when the vapor-deposited thickness was 8.31 nm, 3.01 nm when the vapor-deposited thickness was 5 nm, and 1.92 nm when the vapor-deposited thickness was 10 nm. It can be seen that when the thickness of the buffer layer was from 1 to 10 nm, the surface had a certain roughness. In conjunction with the device structure in FIG. 1, in one aspect, such roughness enables the hole injection layer of the second light emitting unit 130b to be better attached to the material of the buffer layer 140b, and in another aspect, it can also complement the rough surface of the metal layer 140a to make the connection layer 140 to form a relatively dense film as a whole, which inhibits the generation of traps, reduces the recombination at the interface, realizes better compatibility between the films, and allows electrons and holes generated in the connection layer to flow to the light emitting units 130a and 130b respectively and smoothly.

The first electrode 120 is formed on the substrate 110. The first electrode may be a transparent anode of the organic electroluminescent device 100, such as indium tin oxide (ITO), indium zinc oxide (IZO), indium gallium zinc oxide (IGZO) and the like, and such electrode is generally used to prepare a bottom-emitting or transparent device. The first electrode may also be a composite layer that implements specular reflection, such as a stack of ITO/silver (Ag)/ITO, and such electrode is generally used to prepare a top-emitting device. The second electrode 160 is disposed to face the first electrode 120, and is generally a cathode of the organic electroluminescent device 100. The second electrode 160 may be one of, or a combination of two or more of, elements of aluminum, magnesium, silver, gold, calcium, or ytterbium, among which aluminum is generally used as the second electrode of the bottom-emitting device, while magnesium, silver or a magnesium silver alloy is generally used as the second electrode of the top-emitting device.

Two light emitting units 130a and 130b are formed between the first electrode 120 and the second electrode 160. The first light emitting unit 130a and the second light emitting unit 130b may emit light of the same color, or may emit light of different colors, such as a mixture of orange light and blue light, so that the device emits white light. Although not shown in the figure, each light emitting unit at least further includes a hole injection layer, a hole transporting layer, an electron transporting layer and an electron injection layer. Furthermore, some light emitting units may further include one or more of a hole blocking layer and an electron blocking layer. It should be noted that when the hole injection layer of the second light emitting unit is adjacent to the buffer layer of the connection layer, this hole injection layer may further be combined with the connection layer to form a charge generation layer. The hole injection layer of the second light emitting unit may be composed of a single hole injection material or hole transporting material, or may be composed of an organic hole transporting material doped with a dopant, and the dopant may be a buffer layer material. The thickness of each layer can be adjusted according to the optimization result. Each light emitting unit may further include one or two light emitting layers that emit different colors.

Figure 2:
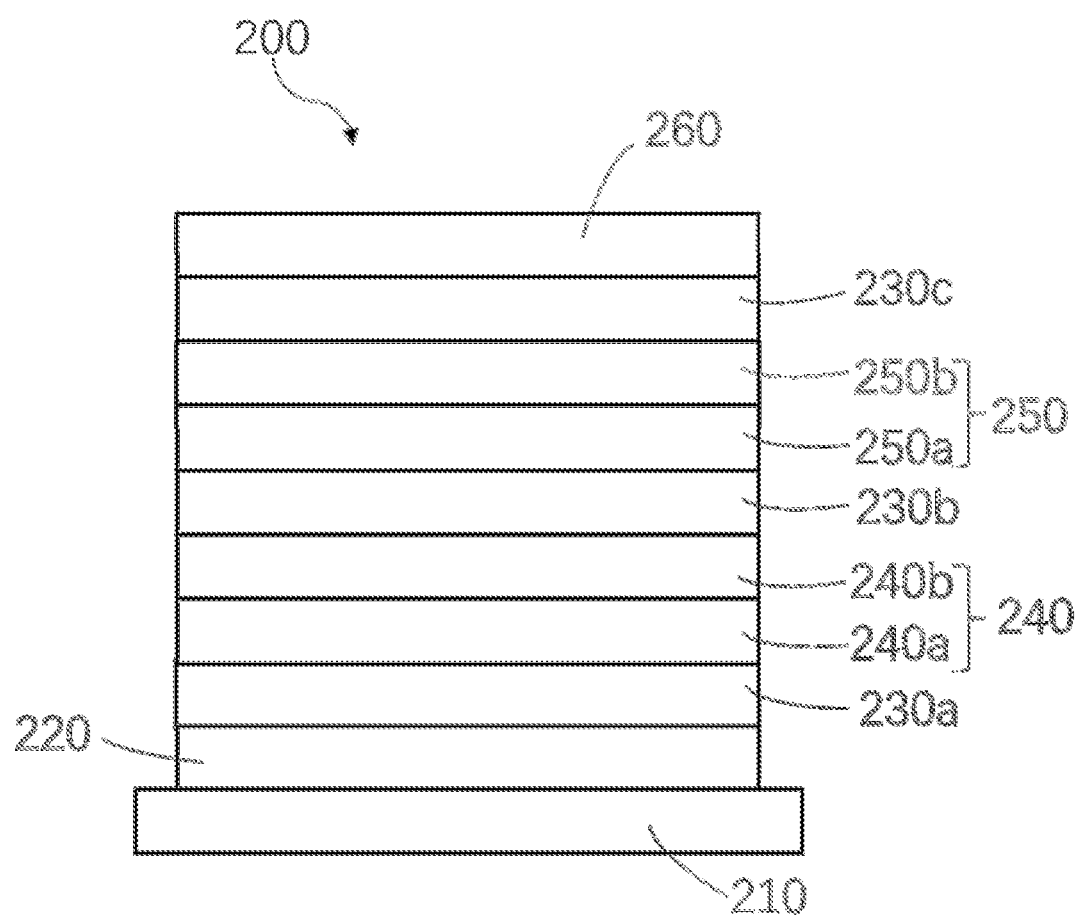
FIG. 2 is a schematic diagram of a tandem organic electroluminescent device 200 according to another specific embodiment of the present disclosure.

The number of light emitting units between the cathode and the anode may also be three or more. As shown in FIG. 2, the tandem organic light emitting device 200 includes three light emitting units 230a, 230b, 230c between the anode 220 and the cathode 260 on the substrate 210, and a connection layer 240 is disposed between the first light emitting unit 230a and the second light emitting unit 230b, where the connection layer 240 includes a metal layer 240a and a buffer layer 240b. A connection layer 250 is disposed between the second light emitting unit 230b and the third light emitting unit 230c, where the connection layer 250 includes a metal layer 250a and a buffer layer 250b. The light emitting units 230a, 230b and 230c may emit the same color, or may emit three different colors, for example, red, green and blue respectively, so that the device emits white light. The connection layers 240 and 250 may use the same material and have the same film thickness, or may use different materials and have different film thicknesses.

The metal layer 140a in the connection layer 140 is used to generate and transport electrons. Therefore, the metal material has a unique advantage, and can be selected from Yb, Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Lu, Y, Mn, Ag or combinations of more than one of the above metals, and preferably, the work function of the metal layer 140*a* is less than 5 eV, more preferably less than 4 eV, such as Yb, Mg, Ca, etc. The thickness of the metal layer 140*a* ranges from 0.1 nm to 20 nm, preferably from 0.1 nm to 5 nm. The thinner the metal layer, the higher the transmittance, so that the luminescence efficiency is improved. Since the thickness of the metal layer 140*a* is very thin, a discontinuous thin film is formed, which allow the surface to have a certain roughness so that the buffer layer 140*b* can be better attached to the metal layer 140*a*, while maintaining excellent electron transport performance. The buffer layer 140*b* is an organic material with the ability to generate or transport holes. The buffer layer 140*b* may be the dopant material used in the hole injection layer, or may be other hole injection or transporting layer materials. The LUMO energy level of the buffer layer 140*b* is greater than 4.9 eV, preferably greater than 5 eV. The thickness of the buffer layer 140*b* ranges from 0.1 nm to 30 nm, preferably from 0.1 nm to 15 nm. Since the thickness of the buffer layer 140*b* is also very thin, a discontinuous film is formed, so that the surface also has a certain roughness, which is complementary to the metal layer 140*a*. The buffer layer 140*b* contains a compound represented by Formula 1.

The connection layer 140 is formed between the light emitting units 130*a* and 130*b*. When the tandem organic electroluminescent device 100 operates, the metal layer 140*a* can provide electrons to the first light emitting unit 130*a* close to the anode 120, and these electrons form excitons with the holes injected by the anode 120. At the same time, the buffer layer 140*b* provides or transports holes to the second light emitting unit 130*b* close to the cathode 160, and these holes form excitons with the electrons injected by the cathode 160. Therefore, in a case where the cathode 160 and the anode 120 inject only one electron and one hole, the device can generate two excitons by itself, so that the efficiency of the device can theoretically be up to twice as high as that of a conventional single-layer OLED.

The connection layer 140 may be prepared in any suitable manner, such as vacuum vapor deposition, vacuum thermal evaporation, sputtering, solution spin-coating, ink-jet printing, organic gasification printing, etc. The metal layer 140*a* can be prepared in a vacuum chamber specific to prepare metals, and the buffer layer can be prepared in a vacuum chamber specific to prepare organic materials. The advantage is that it avoids cross contamination between metals and organic materials during preparation, further improving device performance. At the same time, the quantity of evaporation sources can be further reduced by using the dopant in the hole injection layer as the buffer layer. Furthermore, the layer which is in contact with the buffer layer is the hole injection layer of the second light emitting unit, and since these two layers are generally uses the same material (the material of the buffer layer is used as the dopant of the hole injection layer), the preparation process (usually the vapor deposition process) is more continuous, and the interface between the films can be transitioned more smoothly.

EXAMPLES

The present disclosure will be described below in detail in conjunction with the following examples. Apparently, the following examples are only for illustrative purposes and are not intended to limit the scope of the present disclosure. Based on the following examples, those skilled in the art can obtain other examples of the present disclosure by conducting improvements on these examples.

Figure 3:
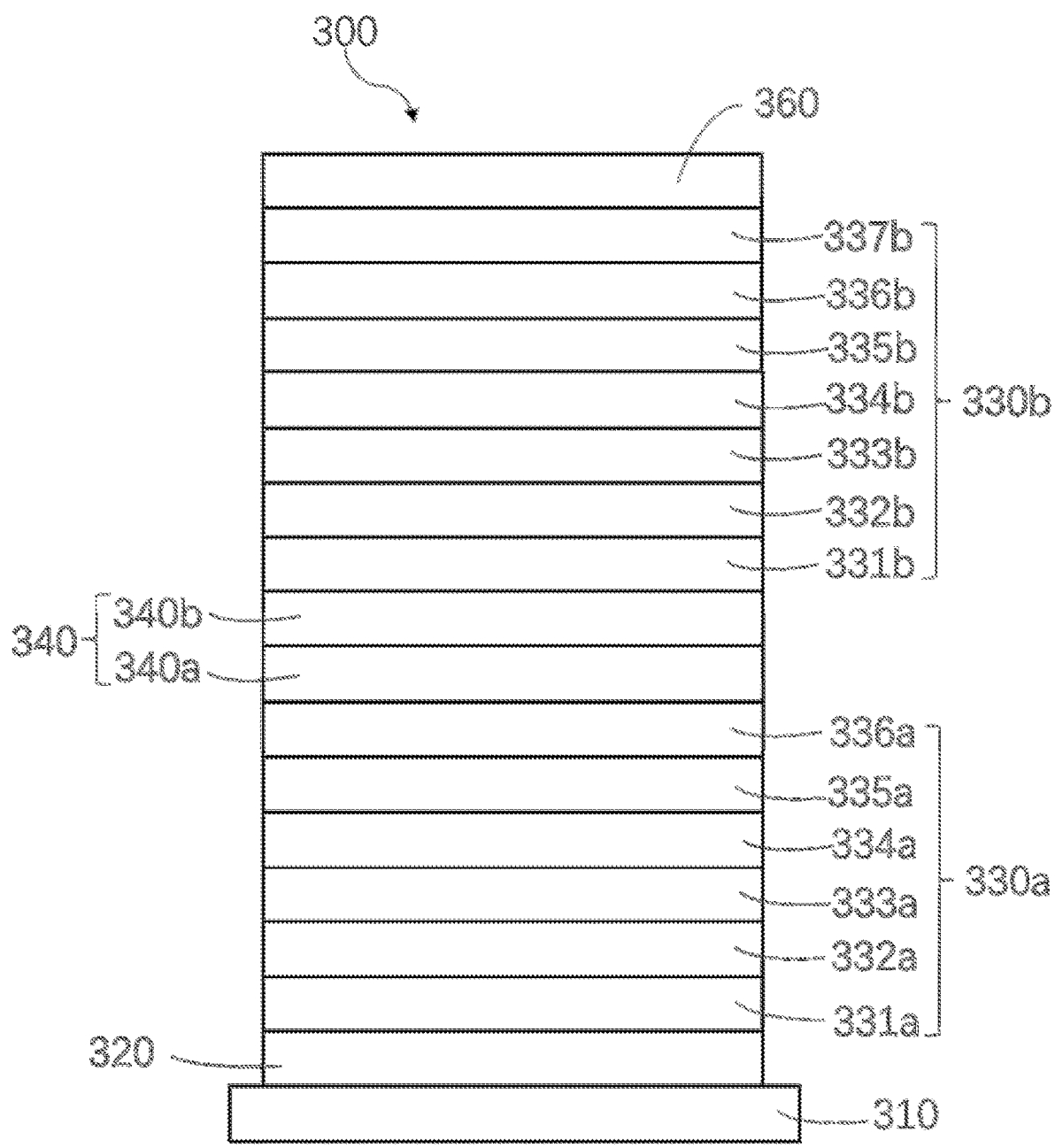
FIG. 3 is a schematic diagram of a tandem organic electroluminescent device 300 according to another specific embodiment of the present disclosure.

Example 1: Preparation of a Red Tandem Organic Electroluminescent Device 300 Including the Connection Layer of the Present Disclosure, as Shown in FIG. 3

First, a glass substrate 310 which was previously coated with a patterned Indium Tin Oxide (ITO) anode 320 with a thickness of 120 nm was cleaned with ultrapure water, and the ITO surface was treated with UV ozone and oxygen plasma. The substrate was dried in a nitrogen-filled glove box to remove moisture, then mounted on a bracket and placed in a vapor deposition chamber. Organic layers specified below were sequentially deposited through thermal evaporation on the ITO anode at a rate of 0.01 to 5 Å/s at a vacuum degree of about $1*10^{-7}$ torr. The first light emitting unit 330*a* was first vapor-deposited, including the following steps. The compound HI was used as a hole injection layer (HIL) 331*a* with the thickness of 100 Å. The compound HT was used as a hole transporting layer (HTL) 332*a* with the thickness of 350 Å. The compound H-1 was used as an electron blocking layer (EBL) 333*a* with the thickness of 50 Å The red host compound H-2 was doped with the red dopant compound D-1 and then was co-deposited as a light emitting layer (EML) 334*a*, in which the dopant concentration was 2% and the total thickness was 400 Å. The compound H-3 was used as a hole blocking layer (HBL) 335*a* with the thickness of 50 Å which was deposited on the light emitting layer. On the HBL, the compound ET and the compound EIL were co-deposited as an electron transporting layer (ETL) 336*a*, in which the compound EIL accounted for 60% of the total weight of ETL layer and the total thickness of ETL layer was 350 Å. After that, sequentially, the metal Yb with the thickness of 15 Å was vapor-deposited as a metal layer 340*a* of a connection layer 340, and the compound 1 with the thickness of 10 Å was vapor-deposited as a buffer layer 340*b* of the connection layer 340. Then, the second light emitting unit 330*b* was vapor-deposited, including the following steps. The compound 1 and the compound HT were vapor co-deposited as a hole injection layer 331*b* with the thickness of 100 Å, wherein the compound 1 accounted for 3% of the total weight of a p-type material layer (i.e., the hole injection layer 331*b*). Note that the hole injection layer 331*b*, together with the metal layer 340*a* and the buffer layer 340*b* of the connection layer 340, may also be considered as a charge generation layer. Then, the compound HT with the thickness of 700 Å was deposited as a hole transporting layer 332*b*, and the compound H-1 was deposited as an electron blocking layer (EBL) 333*b* with the thickness of 50 Å. Then, the red host compound H-2 was doped with the red dopant compound D-1 and then was co-deposited as a light emitting layer (EML) 334*b*, in which the dopant concentration was 2% and the total thickness was 400 Å. The compound H-3 was used as a hole blocking layer (HBL) 335*b* with the thickness of 50 Å which was deposited on the light emitting layer. On the HBL, the compound ET and the compound EIL were co-deposited as an electron transporting layer (ETL) 336*b*, and finally, the compound EIL with the thickness of 10 Å was vapor-deposited as an electron injection layer (EIL) 337*b*, in which the compound EIL accounted for 60% of the total weight of ETL layer and the total thickness of ETL layer was 350 Å, and aluminum with the thickness of 120 nm was vapor-deposited as a cathode 360. Note that the above device structure is only for illustrative and is not limited to the description of the present disclosure. For example, the hole injection layer in the first light emitting unit 330a may use the same structure as in the second light emitting unit 330b, and vice versa. In another example, the second light emitting unit 330b may use host compounds and light emitting materials in other colors as well as corresponding matched transporting materials and device structures. After the device was prepared, the device was transferred from the vapor deposition chamber back to the glove box and packaged with a glass cover. Structure examples of the compound 1, compound HI, compound HT, compound H-1, compound H-2, compound H-3, compound D-1, compound ET and compound EIL are as follows:

Compound 1

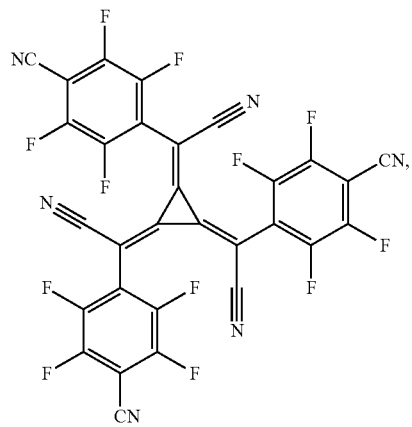

Compound HI

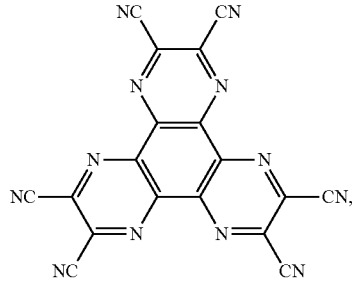

Compound HT

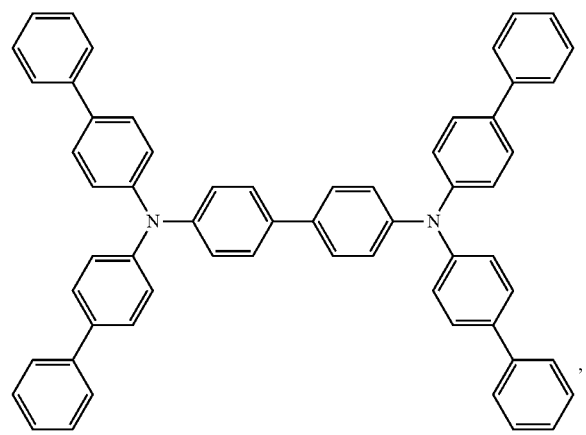

Compound H-1

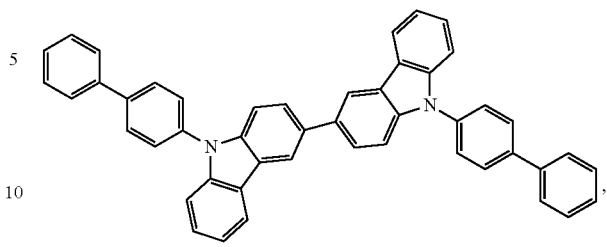

,

Compound H-2

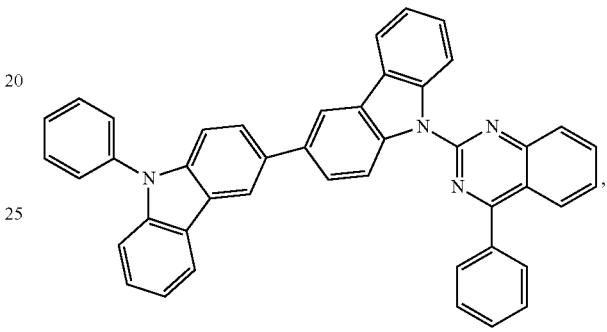

,

Compound H-3

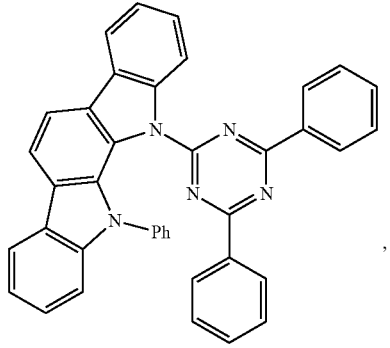

,

Compound D-1

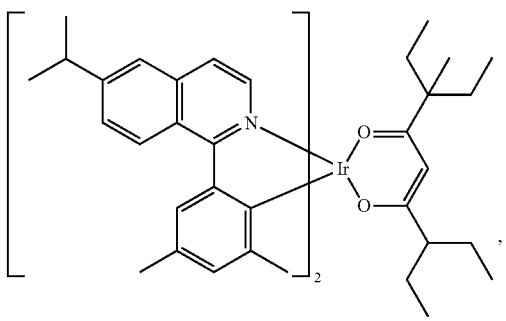

,

Compound ET

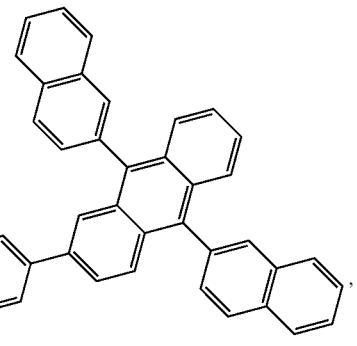

Compound EIL

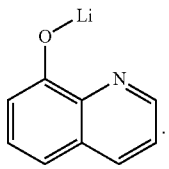

Comparative Example 1: Preparation of a Red Tandem Organic Electroluminescent Device Comprising a Connection Layer Including Only a Metal Layer The preparation method was the same as that in Example 1, except that the connection layer did not have the buffer layer 340b formed by the compound 1.

Table 2 shows the test results of Example 1 and Comparative example 1. The chromaticity coordinates were measured at brightness of 1000 cd/m², the brightness, external quantum efficiency and voltage were measured at the current density of 15 mA/cm², and the life time of the device was the time required to decay to 97% of the initial brightness at 1000 cd/m².

TABLE 2

| | 1000 cd/m² | | 15 mA/cm² | | |
|---|---|---|---|---|---|
| | Chromaticity coordinates (x, y) | Life time (hr) | Brightness (cd/m²) | External quantum efficiency (%) | Voltage (V) |
| Example 1 | 0.685 0.314 | 41832 | 6506 | 49.09 | 9.21 |
| Comparative example 1 | 0.685 0.314 | 24656 | 6318 | 48.07 | 10.65 |

The chromaticity coordinates of Example 1 and Comparative example 1 were identical, which indicates that the buffer layer 340b did not affect the color of the device. The external quantum efficiency of Example 1 was 49.09%, 1.02% higher than that of Comparative example 1. At the current density of 15 mA/cm², the brightness of Example 1 was 6506 cd/m² while the brightness of Comparative example 1 was only 6318 cd/m², and the voltage of Example 1 was 9.21 V while the voltage of Comparative example 1 was as high as 10.65 V, 1.44 V higher than Example 1, which indicates that the use of the buffer layer 340b can effectively reduce the device voltage and improve the efficiency. The life time of Example 1 was 41832 hours at 1000 cd/m² while the life time of Comparative example 1 was only 24656 hours. The life time of the organic electroluminescent device of Example 1 was 1.7 times that of Comparative example 1. This is because the discontinuous buffer layer 340b effectively complements the discontinuous metal layer 340a, so that it inhibits the generation of traps, reduces the recombination at the interface and improves the life time of the device. Meanwhile, since the hole injection layer of the second light emitting unit also uses the material of the buffer layer, the interface transition is smoother, which is also conducive to reducing defects and improving device performance. These results indicate that the organic electroluminescent device of the present disclosure has lower voltage and longer life time.

Figure 5:
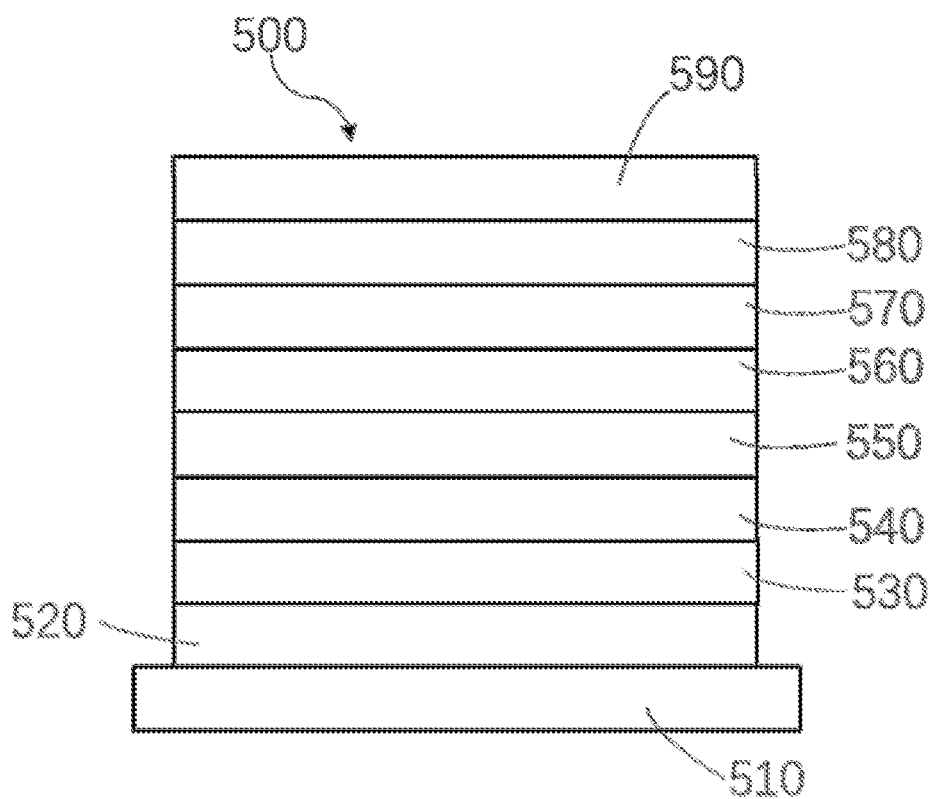
FIG. 5 is a schematic diagram of the structure of a conventional red-light device.

A conventional monolayer device 500, that is, a device using the device structure completely identical with the single light emitting unit 330a or 330b, was also prepared. As shown in FIG. 5, layers were sequentially deposited through thermal evaporation on the ITO anode 510 at a rate of 0.01 to 5 Å/s at a vacuum degree of about $1*10^{-7}$ torr (this figure is an illustration and does not include a substrate layer). The compound HI was used as a hole injection layer (HIL) 520 with the thickness of 100 Å. The compound HT was used as a hole transporting layer (HTL) 530 with the thickness of 350 Å. The compound H-1 was used as an electron blocking layer (EBL) 540 with the thickness of 50 Å. The red host compound H-2 was doped with the red dopant compound D-1 and then was co-deposited as a light emitting layer (EML) 550, in which the total thickness was 400 Å. The compound H-3 was used as a hole blocking layer (HBL) 560 with the thickness of 50 Å which was deposited on the light emitting layer. On the HBL, the compound ET and the compound EIL were co-deposited as an electron transporting layer (ETL) 570, and finally, the compound EIL with the thickness of 10 Å was vapor-deposited as an electron injection layer (EIL) 580, and aluminum with the thickness of 120 nm was vapor-deposited as a cathode 590. The performance of the conventional single layer device is shown in Table 3: at a current density of 15 mA/cm², the brightness was 3027 cd/m², the voltage was 4.83 V, the external quantum efficiency was 23.5%, the life time for decaying to 97% of the initial brightness at 1000 cd/m² was 11764 hours, and the chromaticity coordinates were x=0.683 and y=0.316. Therefore, the brightness and external quantum efficiency of Example 1 were more than twice the brightness and external quantum efficiency of the conventional single layer device, the voltage of Example 1 was 0.42 V lower than twice the voltage of the conventional single layer device, and the life time was also more than three times the life time of the conventional single layer device.

TABLE 3

| | 1000 cd/m² | | 15 mA/cm² | | |
|---|---|---|---|---|---|
| | Chromaticity coordinates (x, y) | Life time (hr) | Brightness (cd/m²) | External quantum efficiency (%) | Voltage (V) |
| Single layer device | 0.683 0.316 | 11764 | 3027 | 23.5 | 4.83 |

Example 2: Preparation of a Tandem Organic Electroluminescent Device Comprising Three Light Emitting Units and Connection Layers of the Present Disclosure The preparation method of Example 2 was the same as that of Example 1, except that a second connection layer 350 and a third light emitting unit 330c were sequentially added between the second light emitting unit 330b and the cathode, where except that the thickness of the hole transporting layer in 330c was 800 Å, the remaining organic layers in 330c were exactly identical to the organic layers in 330b in terms of order, thickness, doping and material, and the metal layer 350a and buffer layer 350b included in the second connection layer 350 were also exactly the same as the connection layer 340. Furthermore, the second light emitting unit 330b herein did not include 337b. For the device structure, reference may be made to FIG. 2.

Comparative Example 2: Preparation of a Tandem Organic Electroluminescent Device Comprising Three Light Emitting Units and Connection Layers without Buffer Layers 340b and 350b The preparation method was the same as that in Example 2, except that the connection layer only had the metal layer. Table 4 shows the test results of Example 2 and Comparative example 2. The chromaticity coordinates were measured at brightness of 1000 cd/m$^2$, the brightness, external quantum efficiency and voltage were measured at the current density of 15 mA/cm$^2$, and the life time of the device was the time required to decay to 97% of the initial brightness at 1000 cd/m$^2$.

TABLE 4

| | 1000 cd/m$^2$ | | 15 mA/cm$^2$ | | |
|---|---|---|---|---|---|
| | Chromaticity coordinates (x, y) | Life time (hr) | Brightness (cd/m$^2$) | External quantum efficiency (%) | Voltage (V) |
| Example 2 | 0.687 0.312 | 70552 | 8827 | 67.40 | 14.03 |
| Comparative example 2 | 0.687 0.312 | 37707 | 8381 | 67.39 | 16.48 |

The chromaticity coordinates of Example 2 and Comparative example 2 were identical, and the external quantum efficiency of Example 2 was 67.40% while the external quantum efficiency of Comparative example 2 was 67.39%, that is, their external quantum efficiencies were basically the same. At the current density of 15 mA/cm$^2$, the brightness of Example 2 was 8827 cd/m$^2$ while the brightness of Comparative example 2 was only 8381 cd/m$^2$. The voltage of Example 2 was 14.03 V, while the voltage of Comparative example was as high as 16.48 V, 2.45 V higher than that of Example 2. The above results also show that, compared with the use of the metal layer alone, the addition of the buffer layer makes the connection layer flatter as a whole, charge transfer is more effective, and therefore the voltage is lower. At the same brightness, the life time of Example 2 was 70552 hours while the life time of Comparative example 2 was only 37707 hours. The life time of the organic electroluminescent device of Example 2 was 1.9 times that of Comparative example 2. The reason for the increase of the life time is as mentioned above. Meanwhile, compared with the conventional single layer device, at the current density of 15 mA/cm$^2$, the voltage was 0.46 V lower than 3 times that of the conventional single layer device, and the brightness and external quantum efficiency were close to 3 times that of the conventional single layer device, and at the same brightness of 1000 cd/m$^2$, the life time was nearly 6 times that of the conventional single layer device.

Figure 4:
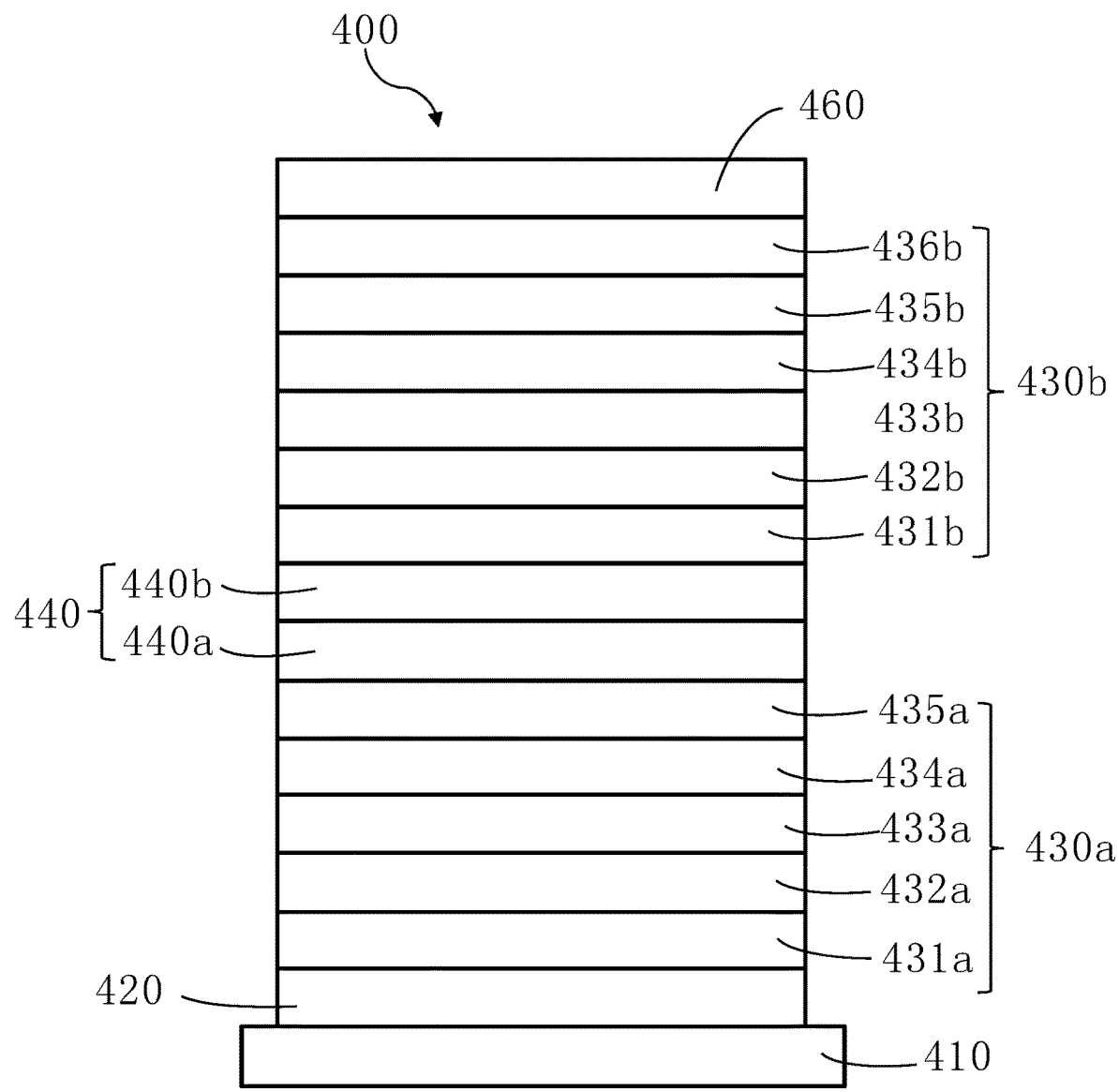
FIG. 4 is a schematic diagram of a tandem organic electroluminescent device 400 according to another specific embodiment of the present disclosure.

Example 3: Preparation of a Yellow Tandem Organic Electroluminescent Device 400 Comprising the Connection Layer of the Present Disclosure, as Shown in FIG. 4

The treatment process of the substrate was the same as that of Example 1, and layers were sequentially deposited through thermal evaporation on the ITO anode 420 at a rate of 0.01 to 5 Å/s at a vacuum degree of about 1*10$^{-7}$ torr. The first light emitting unit 430a was first vapor-deposited, including the following steps. The compound HI was used as a hole injection layer (HIL) 431a with the thickness of 100 Å. The compound HT was used as a hole transporting layer (HTL) 432a with the thickness of 400 Å. Then, the yellow host compound H-3 was doped with the yellow dopant compound D-2 and then was co-deposited as a light emitting layer (EML) 433a, in which the dopant concentration was 20% and the total thickness was 400 Å. The compound H-3 was used as a hole blocking layer (HBL) 434a with the thickness of 100 Å which was vapor-deposited on the light emitting layer. On the HBL, the compound ET and the compound EIL were co-deposited as an electron transporting layer (ETL) 435a, in which the compound EIL accounted for 60% of the total weight of ETL layer and the total thickness of ETL layer was 450 Å. After that, sequentially, the metal Yb with the thickness of 15 Å was vapor-deposited as a metal layer 440a of a connection layer 440, and the compound 1 with the thickness of 10 Å was vapor-deposited as a buffer layer 440b of the connection layer 440. Then, the second light emitting unit 430b was vapor-deposited, including the following steps. The compound 1 and the compound HT were vapor co-deposited as a hole injection layer 431b, in which the compound 1 accounted for 3% of the total weight of a p-type material layer. The compound HT with the thickness of 800 Å was vapor-deposited as a hole transporting layer 432b. The yellow host compound H-3 was doped with the yellow dopant compound D-2 and then was co-deposited as a light emitting layer (EML) 433b, in which the total thickness was 400 Å. The compound H-3 was used as a hole blocking layer (HBL) 434b with the thickness of 100 Å which was deposited on the light emitting layer. On the HBL, the compound ET and the compound EIL were co-deposited as an electron transporting layer (ETL) 435b, and finally, the compound EIL with the thickness of 10 Å was vapor-deposited as an electron injection layer (EIL) 436b, and aluminum with the thickness of 120 nm was vapor-deposited as a cathode 460. The package of the device was the same as that in Example 1. Note that the light emitting unit in this embodiment did not use an electron blocking layer, but still retained an electron injection layer and a hole injection layer indispensable to a basic light emitting unit. The structure example of the compound D-2 is as follows:

Compound D-2

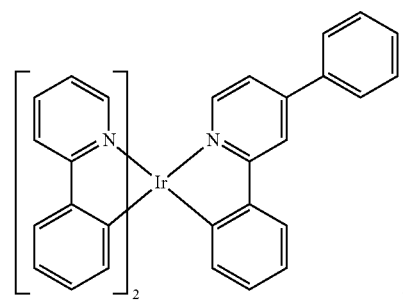

Example 4: Preparation of a Yellow Tandem
Organic Electroluminescent Device Comprising a
Connection Layer Including Buffer Layer 440b
with the Thickness of 50 Å

The preparation method was the same as that in Example 3, except that the thickness of the buffer layer 440b in the connection layer was 50 Å.

Example 5: Preparation of a Yellow Tandem
Organic Electroluminescent Device Comprising a
Connection Layer Including Buffer Layer 440b
with the Thickness of 100 Å

The preparation method was the same as that in Example 3, except that the thickness of the buffer layer 440b in the connection layer was 100 Å.

Example 6: Preparation of a Yellow Tandem
Organic Electroluminescent Device Comprising a
Connection Layer Including Buffer Layer 440b
with the Thickness of 150 Å

The preparation method was the same as that in Example 3, except that the thickness of the buffer layer 440b in the connection layer was 150 Å.

Comparative Example 3: Preparation of a Yellow
Tandem Organic Electroluminescent Device
Comprising a Connection Layer Including Only a
Metal Layer The preparation method was the same as that in Example 3, except that the material of the buffer layer 440b was not vapor-deposited.

Table 5 shows the test results of Examples 3, 4, 5 and 6 and Comparative example 3. The chromaticity coordinates were measured at brightness of 1000 cd/m$^2$, the brightness, external quantum efficiency and voltage were measured at the current density of 15 mA/cm$^2$, and the life time of the device was the time required to decay to 97% of the initial brightness at 1000 cd/m$^2$.

TABLE 5

| | 1000 cd/m$^2$ | | 15 mA/cm$^2$ | | |
|---|---|---|---|---|---|
| | Chromaticity coordinates (x, y) | Life time (hr) | Brightness (cd/m$^2$) | External quantum efficiency (%) | Voltage (V) |
| Example 3 | 0.451 0.541 | 80512 | 18387 | 36.56 | 7.70 |
| Example 4 | 0.454 0.538 | 64174 | 18426 | 36.91 | 7.63 |
| Example 5 | 0.458 0.535 | 63907 | 18275 | 36.84 | 7.46 |
| Example 6 | 0.456 0.537 | 66933 | 18387 | 36.85 | 7.43 |
| Comparative example 3 | 0.447 0.544 | 48991 | 18570 | 36.68 | 8.72 |

In Examples 3 to 6, the thickness of the buffer layer 440b was sequentially increased. The chromaticity coordinates were basically the same. The life time each was more than 60000 hours, and when the thickness was 10 Å, the life time of the device was the highest, reaching 80512 h. The external quantum efficiency of the buffer layer with different thicknesses was almost the same, and the peak value was 36.91% when the thickness was 50 Å. The device voltage decreased as the film thickness increased. Such device performance allows users to optimize and adjust a device according to their own demands. For example, they can use a buffer layer 440b with the thickness of 10 Å to obtain the longest life time, or use a buffer layer 440b with the thickness of 150 Å to obtain the lowest voltage. In Comparative example 3, the device did not include the buffer layer 440b, the color was blue-shifted, and the life time was reduced to 48991 hours, 31521 hours lower than that of Example 3. The voltage of Example 3 increased to 8.72 V, 1.29 V higher than that of Example 6. These results indicate that the device comprising a connection layer with a buffer layer according to the present disclosure has lower voltage and longer life time.

In order to verify the function of the buffer layer with the LUMO energy level greater than 4.9 eV in the connection layer of the present disclosure, HATCN (with the LUMO energy level of 4.81 eV) was used as a buffer layer and compared with the compound 1 (with the LUMO energy level of 5.05 eV) in the connection layer of the present disclosure.

Example 7: Preparation of a Tandem Organic
Electroluminescent Device Comprising a
Connection Layer Including the Buffer Layer of the
Present Disclosure The preparation method was the same as that in Example 1, except that the compound 1 with the thickness of 100 Å was vapor-deposited after the Yb metal layer with the thickness of 10 Å was vapor-deposited and that the second light emitting unit did not include the hole injection layer. Note that in this device structure, the connection layer composed of the metal layer Yb and the buffer layer vapor-deposited by the compound 1 is a charge generation layer, where the metal layer Yb is responsible for generating electrons, and the buffer layer vapor-deposited by the compound 1 is responsible for generating holes.

Comparative Example 4: Preparation of a Tandem
Organic Electroluminescent Device Comprising a
Connection Layer without a Buffer Layer of the
Present Disclosure The preparation method was the same as that in Example 1, except that the compound HI (HATCN) with the thickness of 100 Å was vapor-deposited after the Yb metal layer with the thickness of 10 Å was vapor-deposited and that the second light emitting unit did not include the hole injection layer.

Table 6 shows the test results of Example 7 and Comparative example 4. The chromaticity coordinates were measured at brightness of 1000 cd/m$^2$, the brightness, external quantum efficiency and voltage were measured at the current density of 15 mA/cm$^2$, and the life time of the device was the time required to decay to 97% of the initial brightness at 1000 cd/m$^2$.

TABLE 6

| | 1000 cd/m² | | 15 mA/cm² | | |
| --- | --- | --- | --- | --- | --- |
| | Chromaticity coordinates (x, y) | Life time (hr) | Brightness (cd/m²) | External quantum efficiency (%) | Voltage (V) |
| Example 7 | 0.684  0.315 | 39992 | 6527 | 48.57 | 9.22 |
| Comparative example 4 | 0.686  0.314 | 34255 | 6240 | 47.93 | 9.48 |

With comparison between Example 7 and Comparative example 4, the chromaticity coordinates were almost identical, and at 1000 cd/m², the life time of Example 7 was as high as 39992 hours while the life time of Comparative Example 4 was only 34255 hours. The life time was increased by 16.7%. At 15 mA/cm², the brightness and external quantum efficiency of Example 7 were slightly higher than those of Comparative example 4, but the voltage of Example 7 was only 9.22 V, 0.26 V lower than that of Comparative example. The results of Example 7 and Comparative Example 4 show that the use of a buffer layer with a deeper LUMO level in the connection layer can increase the life time of the device and reduce the voltage of the tandem device.

Example 8: Preparation of a Red Tandem Organic Electroluminescent Device Comprising Two Light Emitting Units and a Connection Layer of the Present Disclosure The preparation method was the same as that in Example 1, except that the thickness of the hole transporting layer of the first light emitting unit 330a was 400 Å, that the material of the buffer layer was the compound 29, and that the hole injection layer of the second light emitting unit 330b was formed by vapor co-deposition of the compound 29 and the compound HT.

The structure example of the compound 29 is as follows:

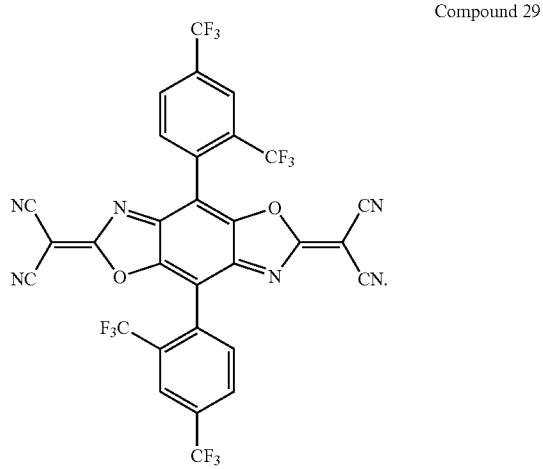 [SMILES: N#CC(C#N)=c1nc2c(-c3ccc(C(F)(F)F)cc3C(F)(F)F)c3oc(=C(C#N)C#N)nc3c(-c3ccc(C(F)(F)F)cc3C(F)(F)F)c2o1]

Compound 29

Table 7 shows the test results of Examples 8 and the conventional single layer device 500. The chromaticity coordinates were measured at brightness of 1000 cd/m², the brightness, external quantum efficiency and voltage were measured at the current density of 15 mA/cm², and the life time of the device was the time required to decay to 97% of the initial brightness at 1000 cd/m².

TABLE 7

| | 1000 cd/m² | | 15 mA/cm² | | |
| --- | --- | --- | --- | --- | --- |
| | Chromaticity coordinates (x, y) | Life time (hr) | Brightness (cd/m²) | External quantum efficiency (%) | Voltage (V) |
| Example 8 | 0.684  0.315 | 89000 | 6386 | 47.8 | 9.84 |
| Single layer device | 0.683  0.316 | 11764 | 3027 | 23.5 | 4.83 |

For Example 8 and the conventional layer device 500, the chromaticity coordinates were basically the same, which indicates that different buffer layer materials would not affect the color of the device. At the current density of 15 mA/cm², the brightness of the single layer device was 3027 cd/m², the voltage was 4.83 V, the external quantum efficiency was 23.5%, and the life time for reducing the initial brightness to 97% at 1000 cd/m² was 11764 hours. Therefore, the brightness and external quantum efficiency of Example 8 were more than twice the brightness and external quantum efficiency of the conventional single layer device, the voltage of Example 8 was 0.18 V higher than twice the voltage of the conventional single layer device (±0.2 V is within the normal experimental error range), which indicates that the voltage of a laminated device prepared using the above-mentioned buffer material is about twice the voltage of the conventional single layer device, and that the addition of the buffer layer material does not increase the voltage. At 1000 cd/m², the life time of Example 8 reached 7.6 times the life time of the conventional single layer device.

In summary, in the tandem OLED, at least one layer of conductive film is required between different light emitting units for carrier transport, so in the above examples, a structure that retains a metal layer was adopted. The above results show that the connection layer composed of the metal layer and the buffer layer made of the organic material with a deep LUMO energy level can solve the problems of high voltage, low life time, and complicated preparation process of the tandem device in the existing art. The connection layer of the present disclosure dispenses with the complicated vapor co-deposition, simplifying the preparation process, and improving the overall performance of the device, especially significantly improving the life time of the device.

The above are only preferred examples of the present disclosure. For those ordinary skilled in the art, according to the idea of the present disclosure, there will be changes in specific implementations and application scopes, and the content of this specification should not be construed as limitations to the present disclosure.

What is claimed is:
1. An organic electroluminescent device, comprising:
   a first electrode,
   a second electrode, and
   at least two light emitting units disposed between the first electrode and the second electrode;
   wherein the light emitting units each comprises at least one light emitting layer;
   wherein a connection layer consisting of a metal layer and a buffer layer is further disposed between at least one set of adjacent two light emitting units, wherein the material of the buffer layer is an organic material; and wherein the light emitting unit in contact with the buffer layer further comprises a hole injection layer, and the hole injection layer of the light emitting unit in contact with the buffer layer comprises the material of the buffer layer.

2. The organic electroluminescent device according to claim 1, wherein the material of the buffer layer is a compound represented by Formula I, or a quinone compound and a derivative thereof:

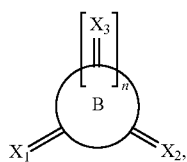

Formula I wherein ring B represents a substituted or unsubstituted carbon ring having 3 to 30 ring atoms or a substituted or unsubstituted heterocyclic ring having 3 to 30 ring atoms;

wherein n is selected from an integer from 0 to 4, and $X_1$, $X_2$ and $X_3$ are, at each occurrence identically or differently, selected from the group consisting of:

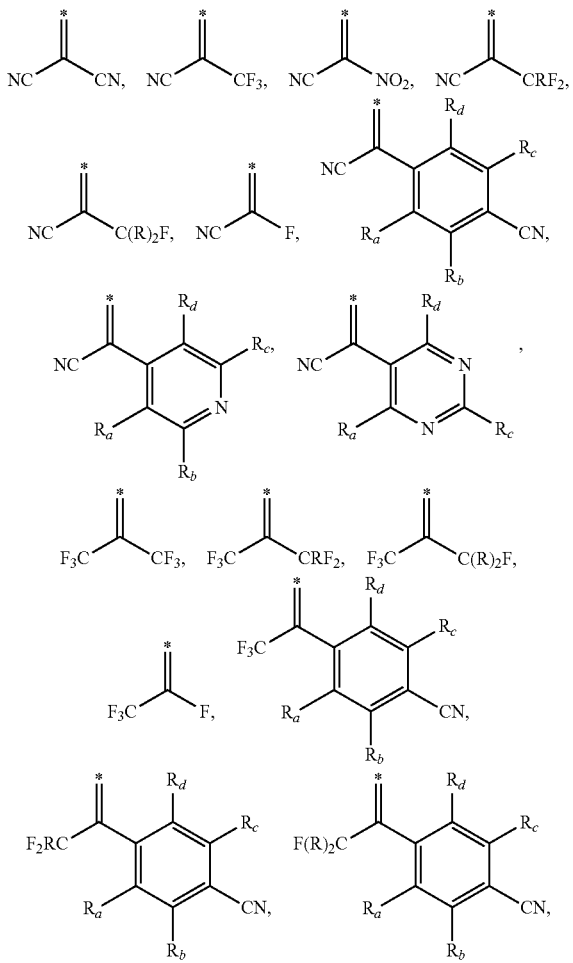

-continued

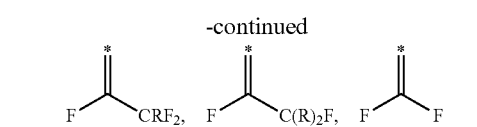

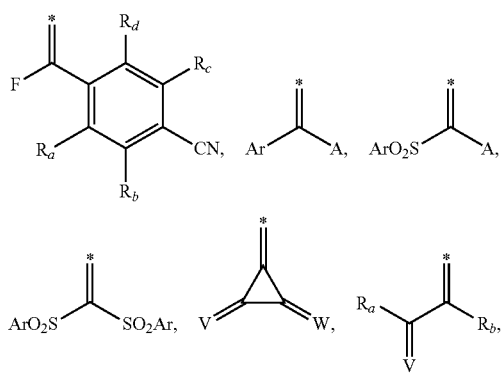

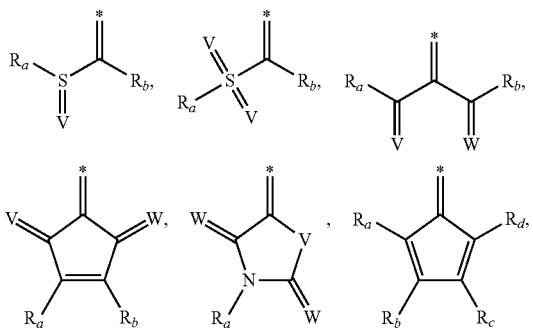

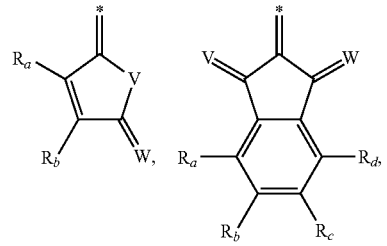

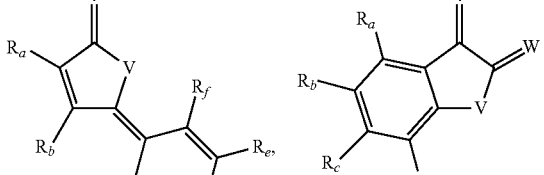

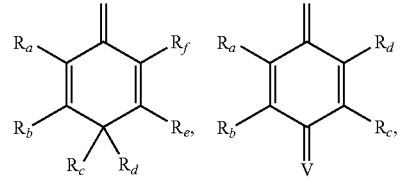

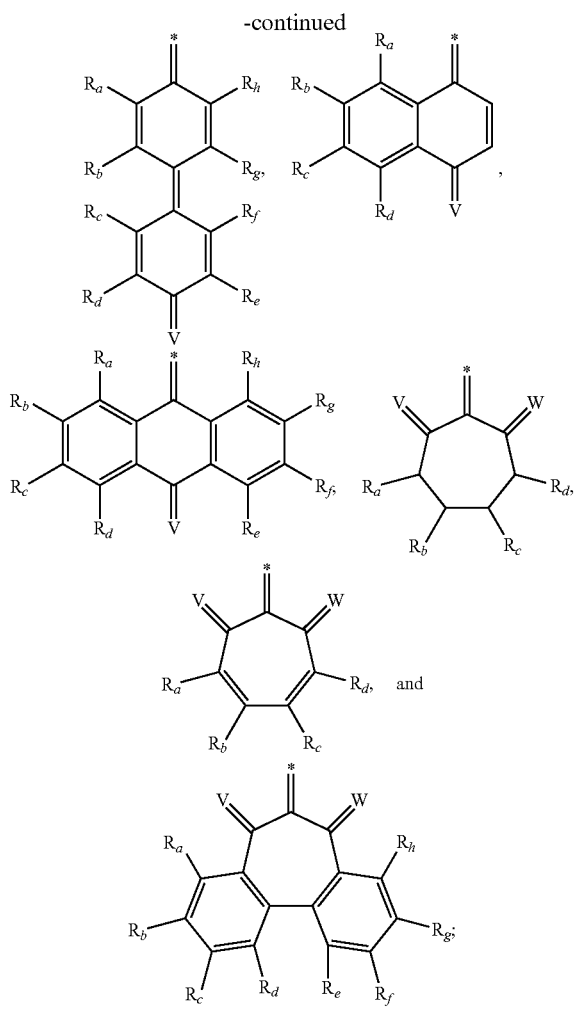

wherein V and W are, at each occurrence identically or differently, selected from $CR_1R_2$, $NR_3$, O, S or Se;

wherein Ar is, at each occurrence identically or differently, selected from substituted or unsubstituted aryl having 6 to 30 carbon atoms, or a substituted or unsubstituted heteroaryl having 3 to 30 carbon atoms;

wherein R, $R_1$, $R_2$, $R_3$, $R_a$, $R_b$, $R_c$, $R_d$, $R_e$, $R_f$, $R_g$ and $R_h$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof;

wherein A is a group having an electron-withdrawing group, and for any of the structures, when one or more of $R_a$, $R_b$, $R_c$, $R_d$, $R_e$, $R_f$, $R_g$ and $R_h$ occur, at least one of $R_a$, $R_b$, $R_c$, $R_d$, $R_e$, $R_f$, $R_g$ and $R_h$ is a group having an electron-withdrawing group; wherein preferably, the electron-withdrawing group is selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

3. The organic electroluminescent device according to claim 2, wherein R is, at each occurrence identically or differently, selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

4. The organic electroluminescent device according to claim 2, wherein $X_1$, $X_2$ and $X_3$ are, at each occurrence identically or differently, selected from the group consisting of the following structures:

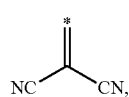

A1

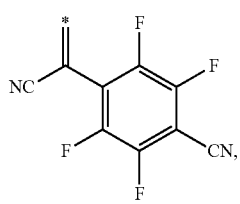

A2

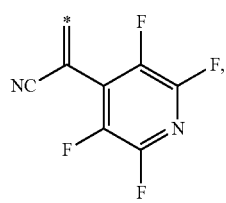

A3

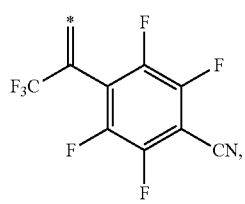

A4

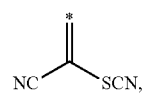

A5

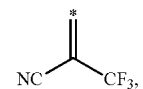

A6

A7
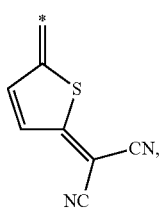

A8
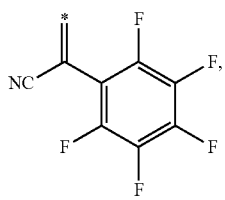

A9
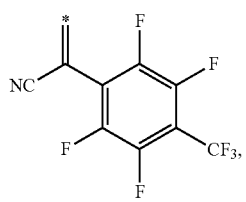

A10
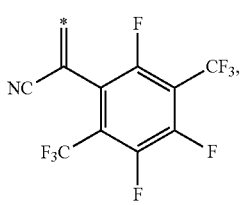

A11
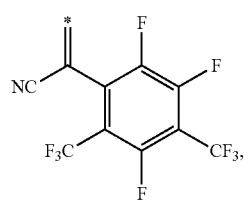

A12
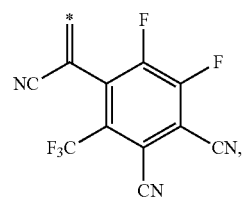

A13
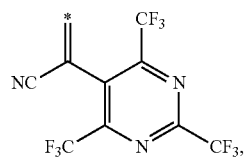

A14
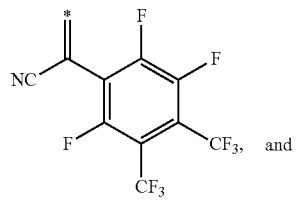

A15

5. The organic electroluminescent device according to claim 2, wherein the ring B is selected from the group consisting of the following structures:

B1

B2

B3
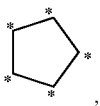

B4
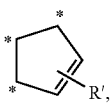

B5

B6
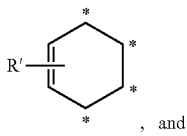

, and

B7
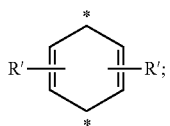

;

wherein R' represents mono-substitution or di-substitution, and is, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, unsubstituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof; and adjacent substituents R' can be optionally joined to form a ring.

6. The organic electroluminescent device according to claim 1, wherein the material of the buffer layer is selected from the group consisting of:

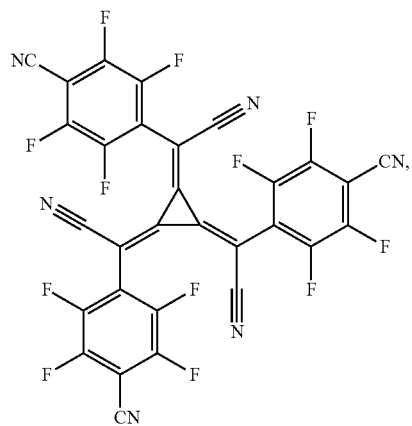

Compound 1

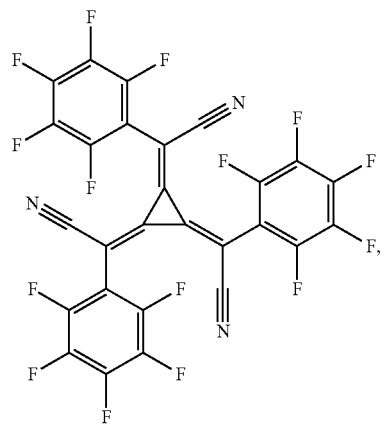

Compound 2

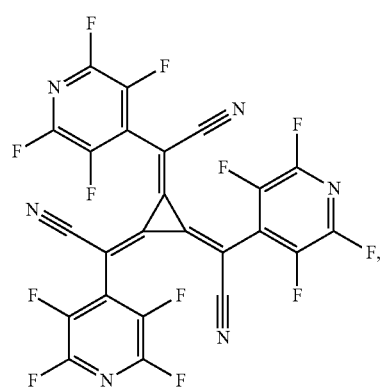

Compound 3

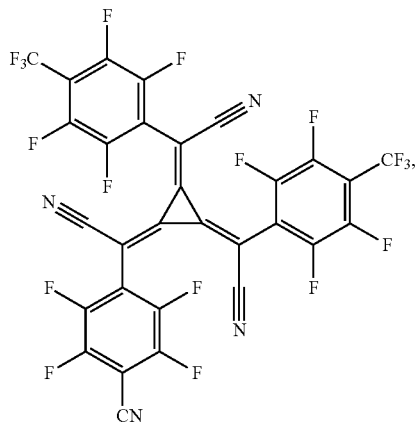

Compound 4

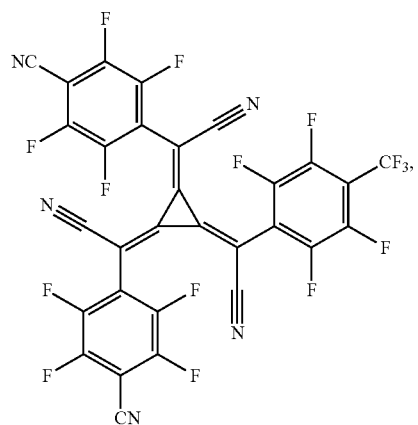

Compound 5

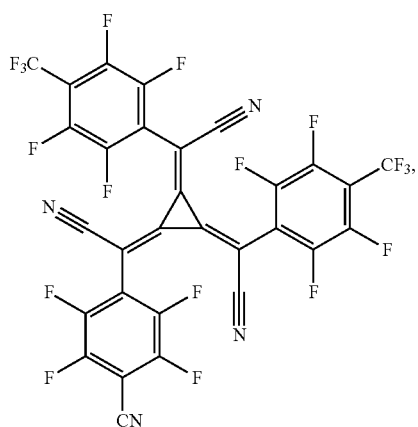

Compound 6

Compound 7
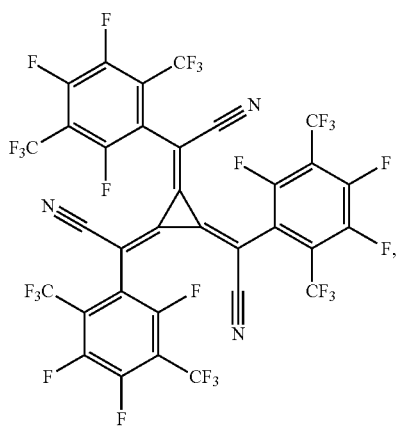
Compound 8
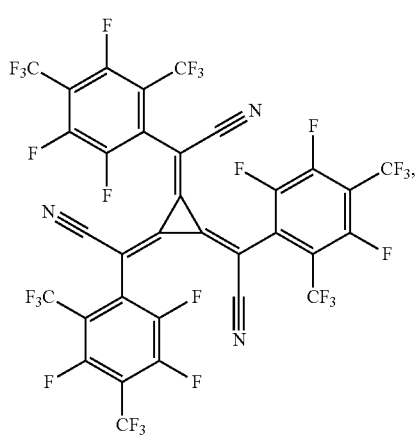
Compound 9
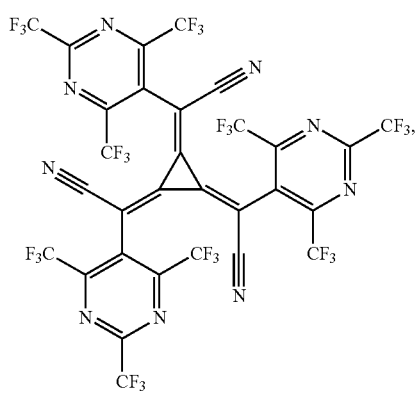
Compound 10
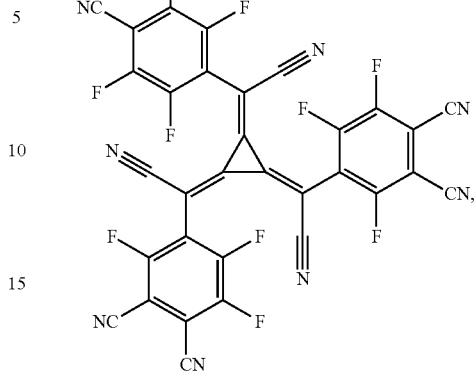
Compound 11
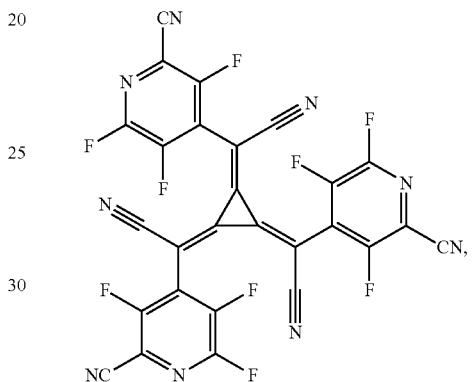
Compound 12
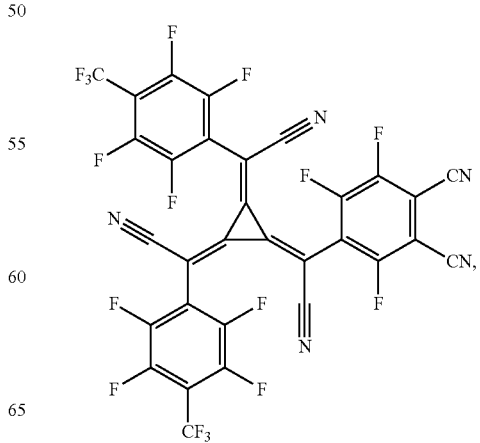
Compound 13

-continued
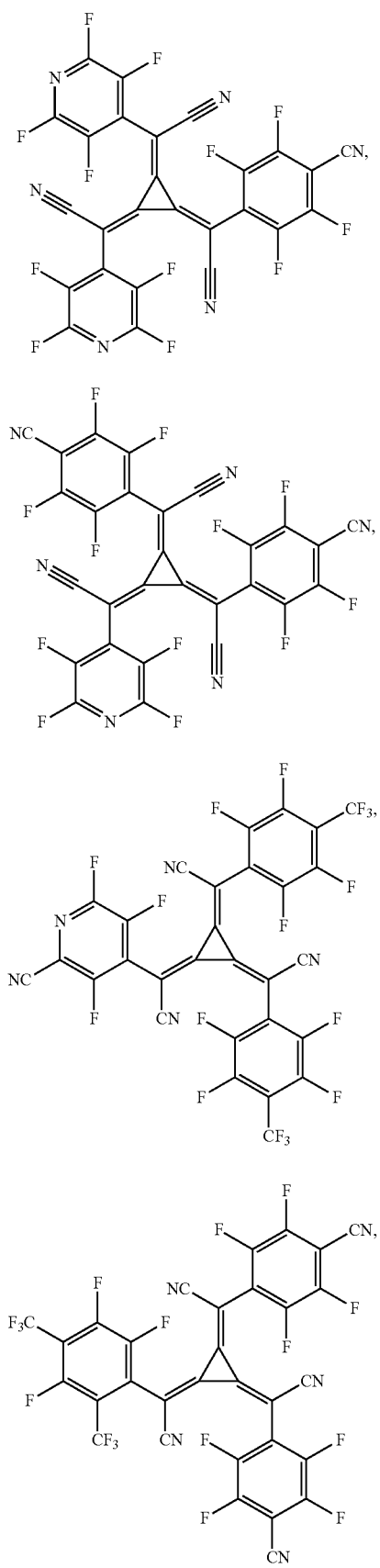
Compound 14
Compound 15
Compound 16
Compound 17
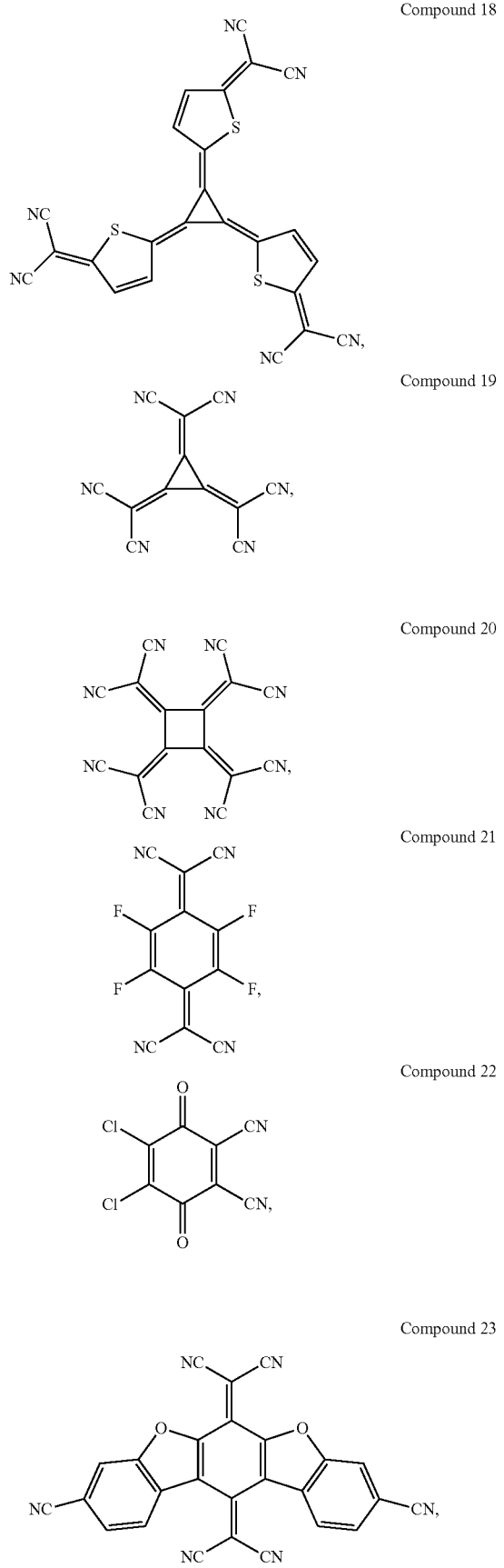
Compound 18
Compound 19
Compound 20
Compound 21
Compound 22
Compound 23

Compound 24
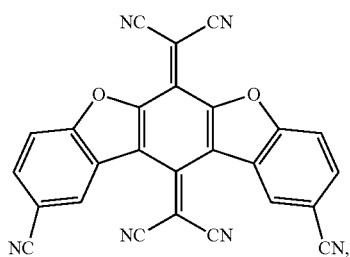

Compound 25
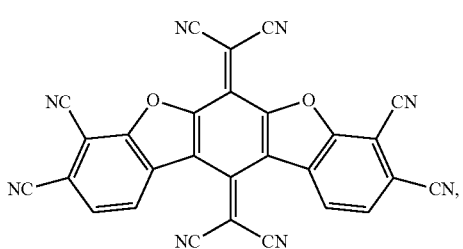

Compound 26
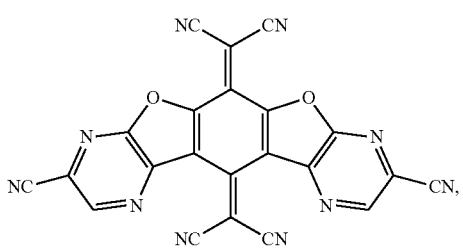

Compound 27
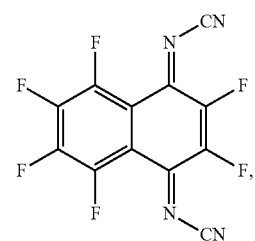

Compound 28
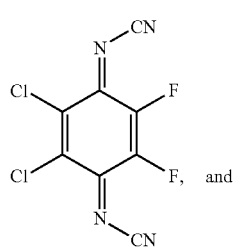
and

Compound 29
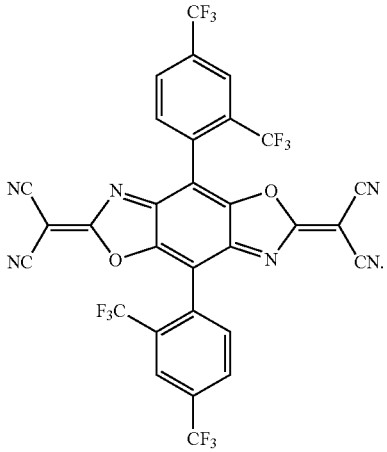

7. The organic electroluminescent device according to claim 1, wherein a metal in the metal layer is selected from the group consisting of: Yb, Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Lu, Y, Mn, Ag, and combinations of a plurality thereof.

8. The organic electroluminescent device according to claim 1, wherein the metal layer is formed by vapor deposition of one elemental metal, or is formed by vapor co-deposition of two or more elemental metals.

9. The organic electroluminescent device according to claim 1, wherein the buffer layer has a thickness ranging from 0.1 nm to 30 nm, preferably from 0.1 nm to 15 nm;
   optionally, the metal layer has a thickness ranging from 0.1 nm to 20 nm, preferably from 0.1 nm to 5 nm;
   optionally, the metal of the metal layer has a work function of less than 4 eV;
   optionally, the material of the buffer layer has a LUMO energy level of greater than 4.9 eV, preferably greater than 5 eV;
   optionally, transmittance of the connection layer in a visible light range is greater than 70%;
   optionally, the at least two light emitting units are capable of emitting light of the same or light of different colors;
   optionally, at least one of the buffer layer and the metal layer forms a discontinuous film.

10. An organic electroluminescent device, comprising:
   a first electrode,
   a second electrode, and
   at least two light emitting units disposed between the first electrode and the second electrode,
   wherein the light emitting units each comprises at least one light emitting layer;
   wherein a connection layer consisting of a metal layer and a buffer layer is further disposed between at least one set of adjacent two light emitting units;
   wherein a material of the buffer layer is an organic material, and the organic material has a lowest unoccupied molecular orbital (LUMO) energy level of greater than 4.9 eV.

11. The organic electroluminescent device according to claim 10, wherein the material of the buffer layer is a compound represented by Formula I, or a quinone compound and a derivative thereof:

Formula I
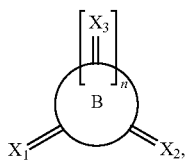
wherein ring B represents a substituted or unsubstituted carbon ring having 3 to 30 ring atoms or a substituted or unsubstituted heterocyclic ring having 3 to 30 ring atoms;
wherein n is selected from an integer from 0 to 4, and $X_1$, $X_2$ and $X_3$ are, at each occurrence identically or differently, selected from the group consisting of:
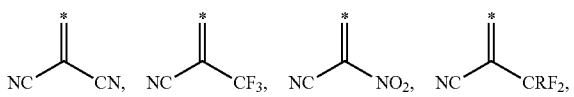
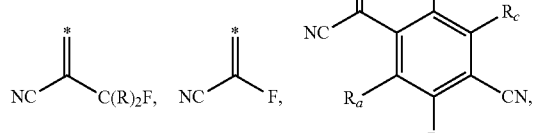
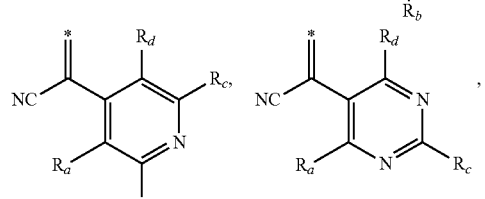
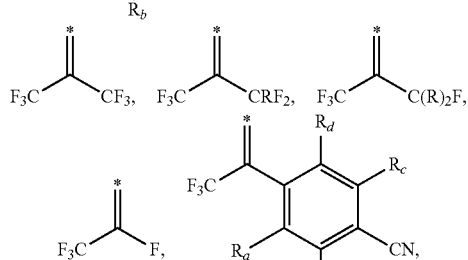
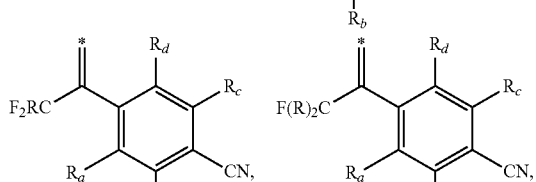
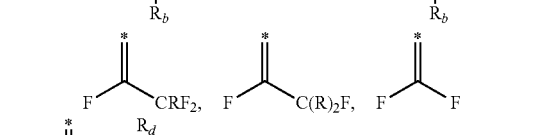
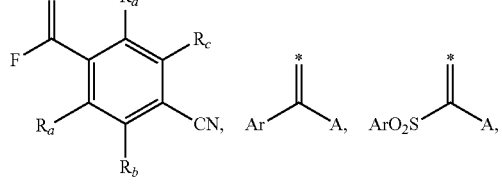
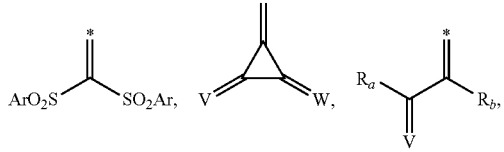
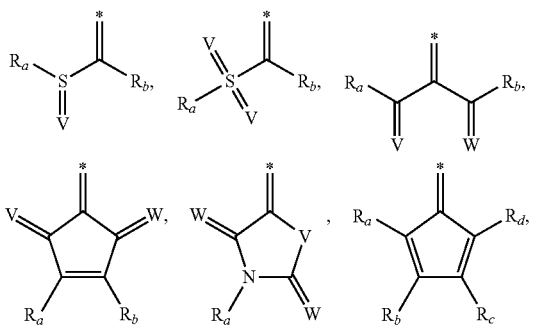
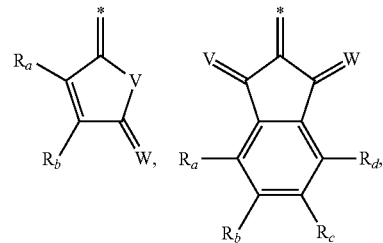
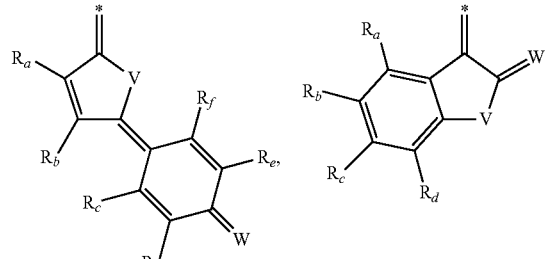
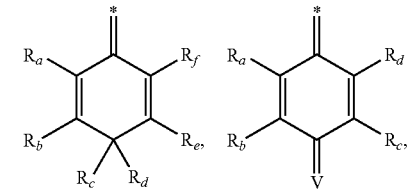
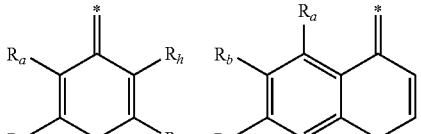

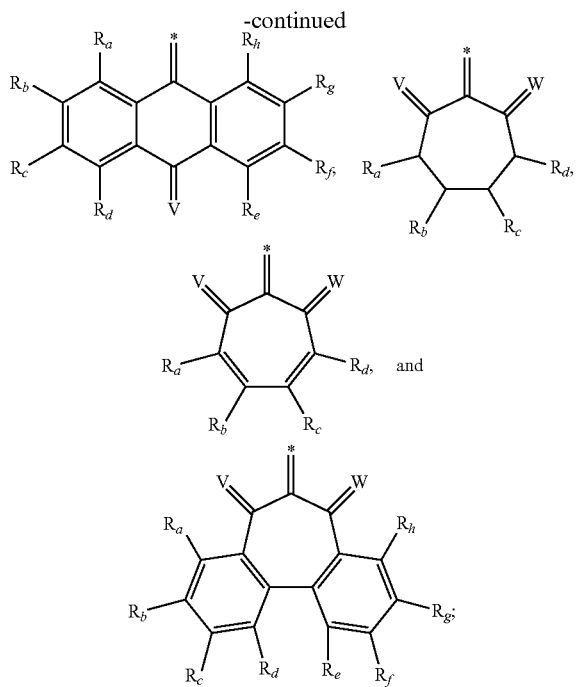

wherein V and W are, at each occurrence identically or differently, selected from $CR_1R_2$, $NR_3$, O, S or Se;

wherein Ar is, at each occurrence identically or differently, selected from substituted or unsubstituted aryl having 6 to 30 carbon atoms, or a substituted or unsubstituted heteroaryl having 3 to 30 carbon atoms;

wherein R, $R_1$, $R_2$, $R_3$, $R_a$, $R_b$, $R_c$, $R_d$, $R_e$, $R_f$, $R_g$ and $R_h$ are, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, unsubstituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof;

wherein A is a group having an electron-withdrawing group, and for any of the structures, when one or more of $R_a$, $R_b$, $R_c$, $R_d$, $R_e$, $R_f$, $R_g$ and $R_h$ occur, at least one of $R_a$, $R_b$, $R_c$, $R_d$, $R_e$, $R_f$, $R_g$ and $R_h$ is a group having an electron-withdrawing group; wherein preferably, the electron-withdrawing group is selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

12. The organic electroluminescent device according to claim 11, wherein R is, at each occurrence identically or differently, selected from the group consisting of: F, $CF_3$, $OCF_3$, $SF_5$, $SO_2CF_3$, a cyano group, an isocyano group, SCN, OCN, pentafluorophenyl, 4-cyanotetrafluorophenyl, tetrafluoropyridyl, pyrimidyl, triazine, and combinations thereof.

13. The organic electroluminescent device according to claim 11, wherein $X_1$, $X_2$ and $X_3$ are, at each occurrence identically or differently, selected from the group consisting of the following structures:

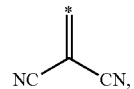

A1

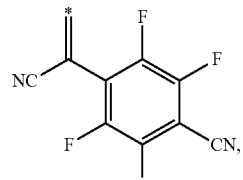

A2

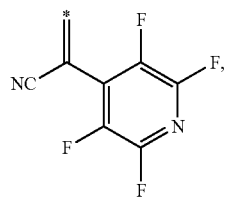

A3

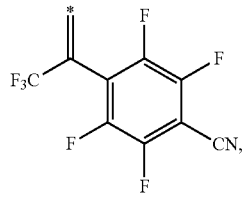

A4

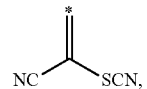

A5

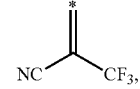

A6

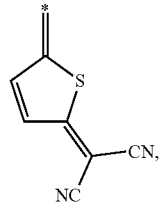

A7

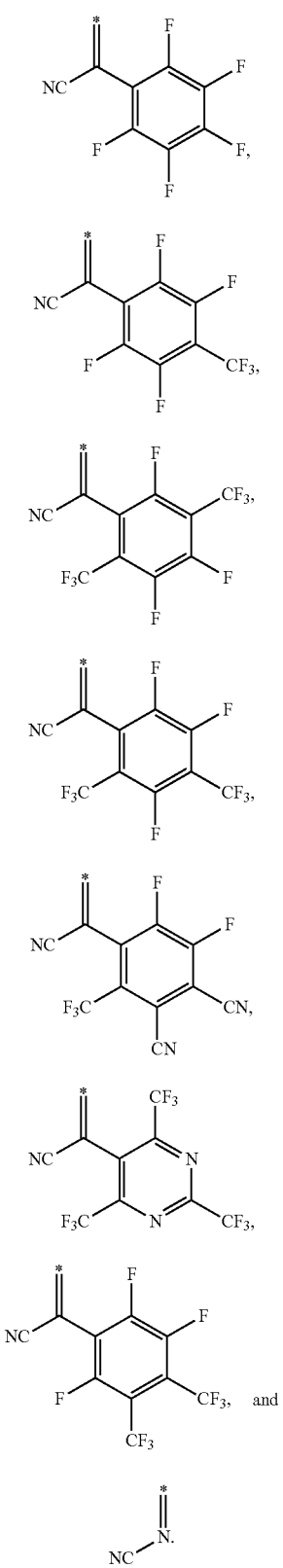

  B1

  B2

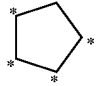  B3

  B4

  B5

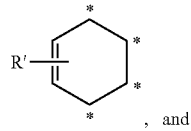  B6 , and

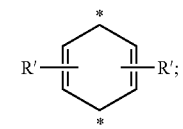  B7;

wherein R' represents mono-substitution or di-substitution, and is, at each occurrence identically or differently, selected from the group consisting of: hydrogen, deuterium, halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphinoxy group, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, unsubstituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof; and adjacent substituents R' can be optionally joined to form a ring.

14. The organic electroluminescent device according to claim 11, wherein the ring B is selected from the group consisting of the following structures:

15. The organic electroluminescent device according to claim 10, wherein the material of the buffer layer is selected from the group consisting of:

Compound 1
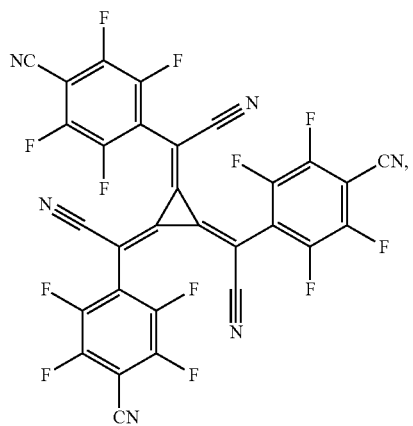
Compound 2
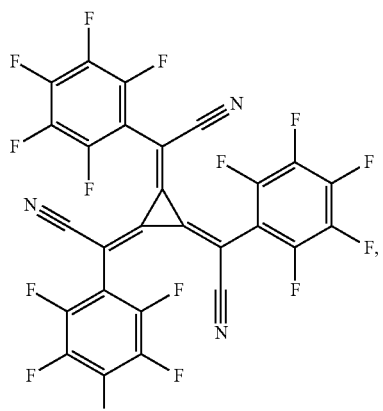
Compound 3
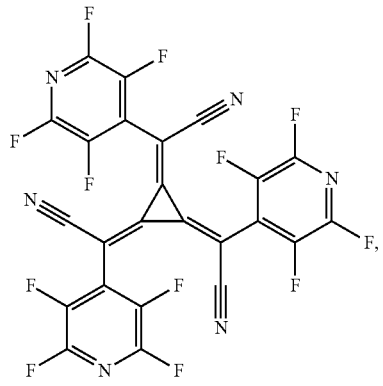
Compound 4
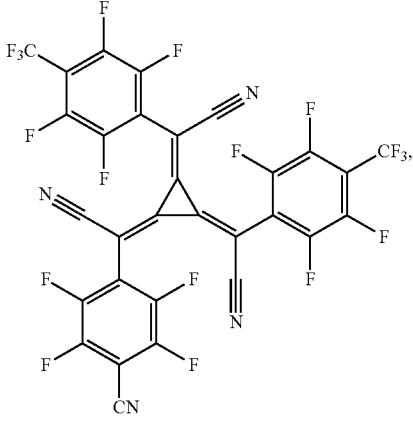
Compound 5
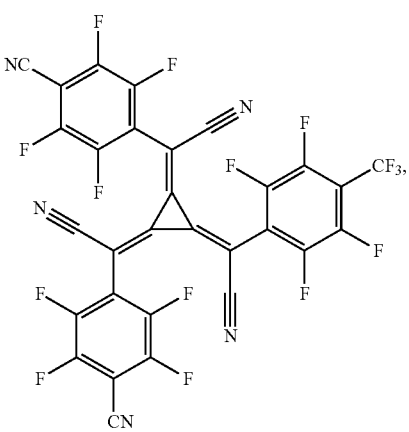
Compound 6
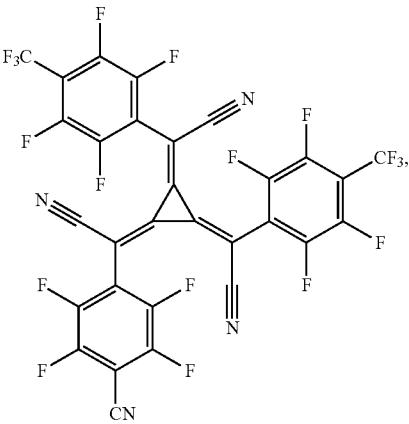
Compound 7
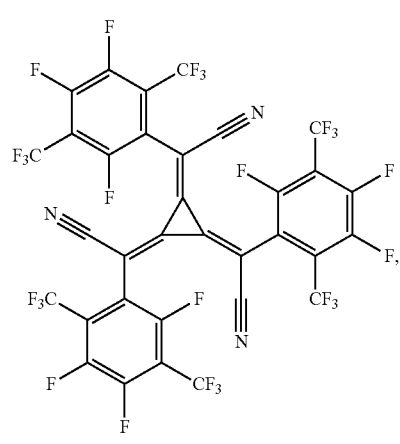

Compound 8
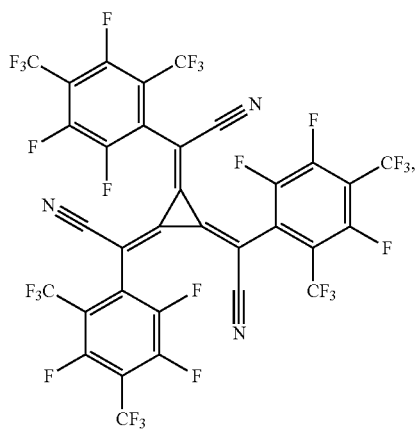
Compound 9
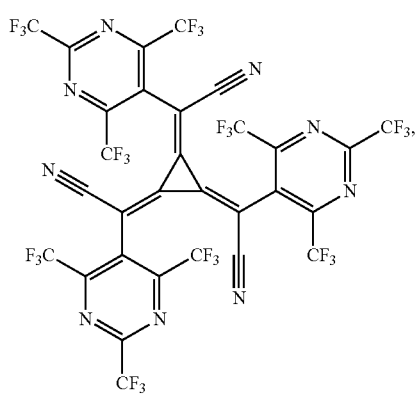
Compound 10
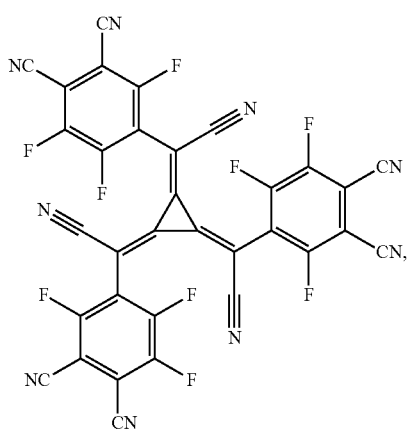
Compound 11
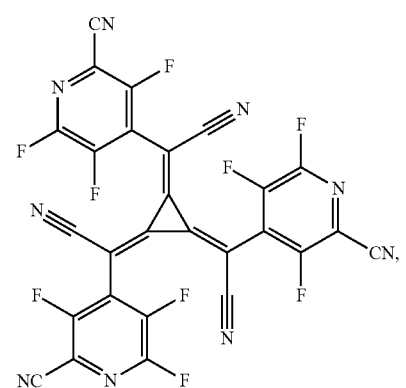
Compound 12
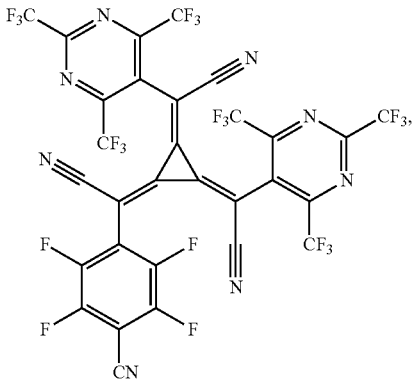
Compound 13
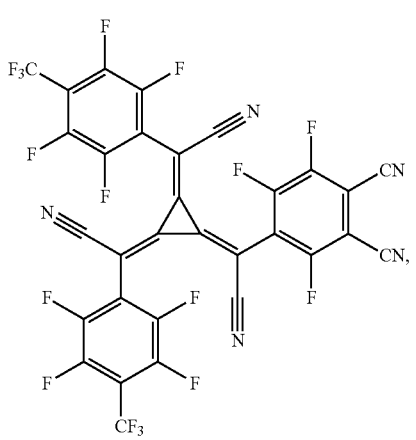
Compound 14
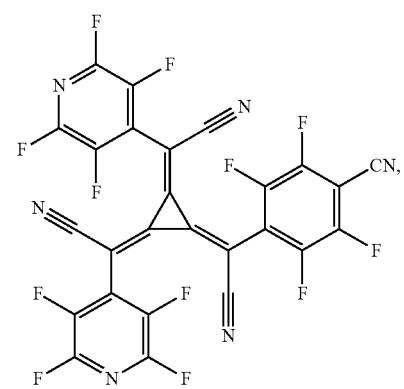
Compound 15
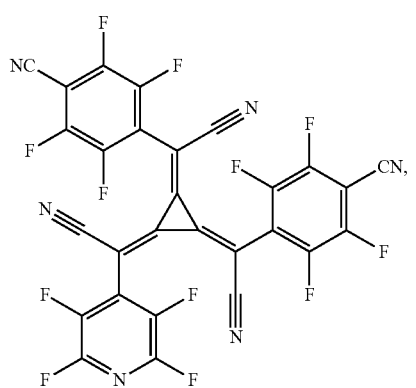

Compound 16
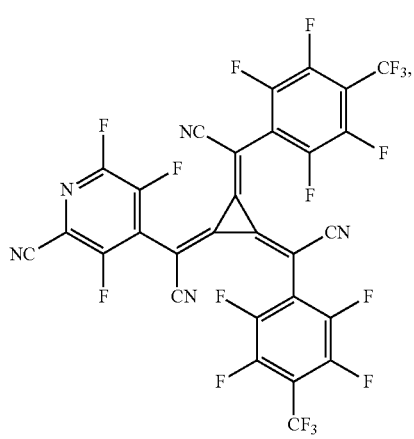
Compound 17
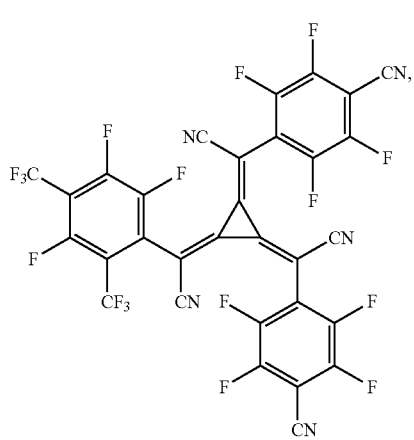
Compound 18
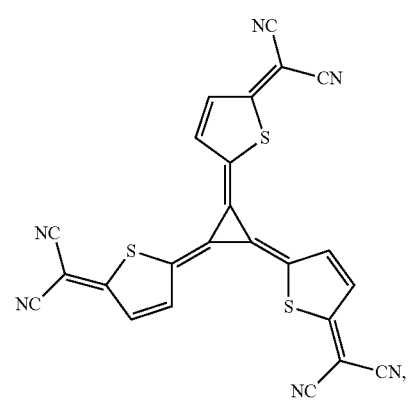
Compound 19
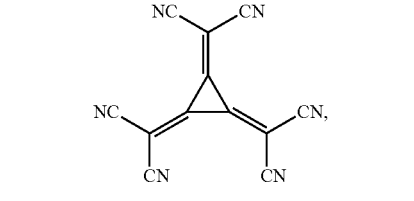
Compound 20
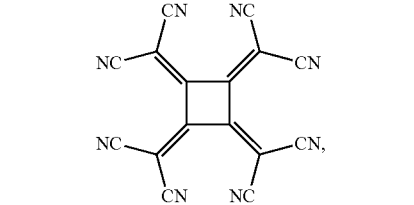
Compound 21
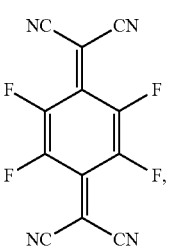
Compound 22
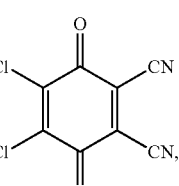
Compound 23
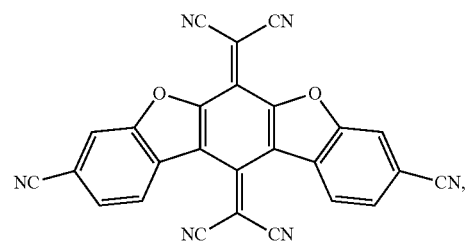
Compound 24
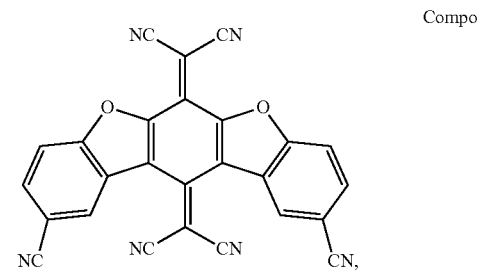
Compound 25
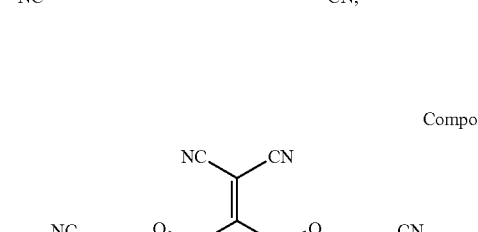
Compound 26
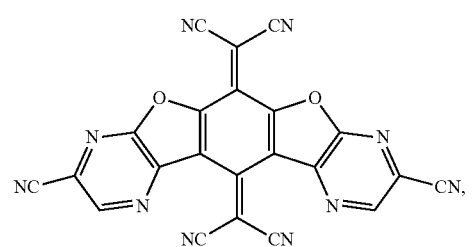

-continued

Compound 27

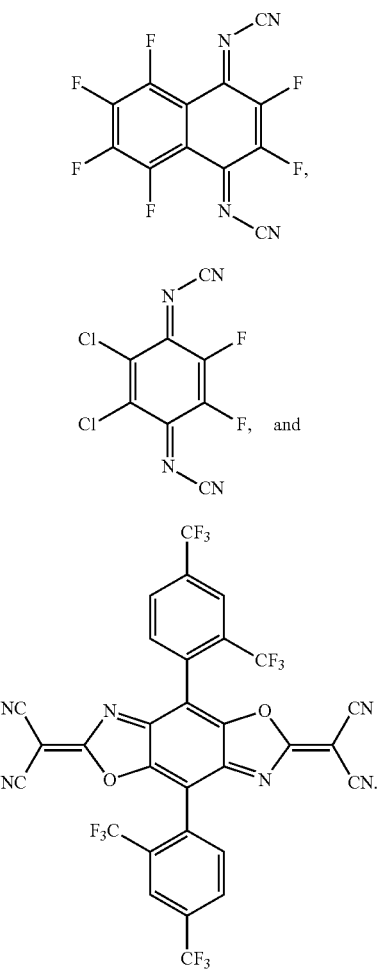

Compound 28

Compound 29

16. The organic electroluminescent device according to claim 10, wherein a metal in the metal layer is selected from the group consisting of: Yb, Li, Na, K, Rb, Cs, Fr, Be, Mg, Ca, Sr, Ba, Ra, La, Ce, Pr, Nd, Sm, Eu, Tb, Th, Dy, Ho, Er, Em, Gd, Lu, Y, Mn, Ag, and combinations of a plurality thereof.

17. The organic electroluminescent device according to claim 10, wherein the metal layer is formed by vapor deposition of one elemental metal, or is formed by vapor co-deposition of two or more elemental metals.

18. The organic electroluminescent device according to claim 10, wherein the buffer layer has a thickness ranging from 0.1 nm to 30 nm, preferably from 0.1 nm to 15 nm;

optionally, the metal layer has a thickness ranging from 0.1 nm to 20 nm, preferably from 0.1 nm to 5 nm;

optionally, the metal of the metal layer has a work function of less than 4 eV;

optionally, the material of the buffer layer has a LUMO energy level of greater than 4.9 eV, preferably greater than 5 eV;

optionally, transmittance of the connection layer in a visible light range is greater than 70%;

optionally, the at least two light emitting units are capable of emitting light of the same or light of different colors;

optionally, at least one of the buffer layer and the metal layer forms a discontinuous film.

19. A display assembly, comprising the organic electroluminescent device according to claim 1.

20. A display assembly, comprising the organic electroluminescent device according to claim 10.

* * * * *